US007242705B2

(12) United States Patent
Kneissl et al.

(10) Patent No.: US 7,242,705 B2
(45) Date of Patent: Jul. 10, 2007

(54) GRATING-OUTCOUPLED CAVITY RESONATOR HAVING UNI-DIRECTIONAL EMISSION

(75) Inventors: Michael A. Kneissl, Mountain View, CA (US); Noble M. Johnson, Menlo Park, CA (US); David K. Biegelsen, Portola Valley, CA (US)

(73) Assignee: Palo Alto Research Center, Incorporated, Palo Alto, CA (US)

( * ) Notice: Subject to any disclaimer, the term of this patent is extended or adjusted under 35 U.S.C. 154(b) by 211 days.

(21) Appl. No.: 10/736,602

(22) Filed: Dec. 17, 2003

(65) Prior Publication Data

US 2005/0135453 A1 Jun. 23, 2005

(51) Int. Cl.
*H01S 3/07* (2006.01)
*H01S 5/00* (2006.01)
(52) U.S. Cl. ..................................... 372/67; 372/50.11
(58) Field of Classification Search ................. 372/67, 372/50.11
See application file for complete search history.

(56) References Cited

U.S. PATENT DOCUMENTS

| | | | | |
|---|---|---|---|---|
| 5,343,490 | A * | 8/1994 | McCall | 372/94 |
| 5,559,824 | A * | 9/1996 | Baird et al. | 372/95 |
| 6,219,369 | B1 * | 4/2001 | Portnoi et al. | 372/96 |
| 6,330,265 | B1 * | 12/2001 | Kinoshita | 372/50.12 |
| 6,638,773 | B1 * | 10/2003 | Hwang et al. | 438/2 |

2004/0218654 A1  11/2004  Kneissl et al.

FOREIGN PATENT DOCUMENTS

| | | |
|---|---|---|
| EP | 0 533 390 A1 | 3/1993 |
| JP | 59-172286 A | 9/1984 |
| JP | 06-152047 A | 5/1994 |
| JP | 06-252504 A | 9/1994 |

OTHER PUBLICATIONS

Rex, N.B. et al., "Threshold Lowering in GaN Micropillar Lasers By Means of Spatially Selective Optical Pumping," *IEEE Photon. Tech. Lett* vol. 13, No. 1, Jan. 1, 2001., pp. 1-3.
Rex, N. et al., "Fresnel Filtering in Lasing Emission from Scarred Modes of Wave-Chaotic Optical Resonators," *Phys. Rev. Lett.*, vol. 88, art. No. 094102-1 -094102-4 (2002).
Poon, A. W. et al., "Multimode Resonances in Square-Shaped Optical Microcavities," *Opt. Lett*, vol. 26, No. 9, May 1, 2001, pp. 632-634.
Tureci, H.E. et al., "Deviation from Snell's Law for Beams Transmitted Near the Critical Angle: Application to Microcavity Lasers," *Opt. Lett.*, vol. 27, No. 1, Jan. 1, 2002, pp. 7-9.

(Continued)

*Primary Examiner*—Minsun Harvey
*Assistant Examiner*—Marcia A. Golub
(74) *Attorney, Agent, or Firm*—Oliff & Berridge PLC

(57) ABSTRACT

A grating-outcoupled microcavity disk resonator has whispering gallery modes existing in a nearly circular resonator. Light is outcoupled by providing a grating region in the plane of the grating-outcoupled microcavity disk resonator. The grating region provides an outcoupling or loss mechanism that symmetrically interacts with the clockwise and counterclockwise whispering gallery modes, thereby making the resonator capable of surface emission.

30 Claims, 18 Drawing Sheets

OTHER PUBLICATIONS

Nockel, J.U. et al., "Ray and Wave Chaos in Asymmetric Resonant Optical Cavities," *Nature*, vol. 385, No. 45 (1997).

Gmachl, C. et al., "High-Power Directional Emission From Microlasers With Chaotic Resonators," *Science* vol. 280, Jun. 5, 1998, pp. 1556-1564.

Nockel, J.U. et al., "Directional Emission from Asymmetric Resonant Cavities," *Opt. Lett.*, vol. 21, No. 19, Oct. 1, 1996, pp. 1609-1611.

Chang, S. et al., "Observation of Emission from Chaotic Lasing Modes in Deformed Microspheres: Displacement by the Stable-Orbit Modes," *J. Opt. Soc. Am. B-Opt. Phys.*, 17 (2002).

Schwefel, H.G.L. et al., "Dramatic Shape Sensitivity of Emission Patterns for Similarly Deformed Cylindrical Polymer Lasers," *CLEO/OELS* May 2002, pp. 24-25.

Tureci, H.E. et al., "Lasing Emission From Stable and Unstable Modes of Deformed GaN Microdisks," *CLEO/OELS*, May 2002, pp. 23-24.

Chern, G.D. et al., "Directional Laser Emission from Square, Spiral and Mismatched Semi-Circular Dye-Doped Polymer Based Micropillar Cavities," *CLEO/OELS* May 2002, pp. 25-26.

Rex, N.B. et al., "Directional Laser Emission From Chaotic Modes in Quadrupole-Deformed GaN Microdisks," *CLEO/OELS* May 2000, pp. 178-179.

Rex, N.B. et al., "Threshold Minimization and Directional Laser Emission From GaN Microdisks," *SPIE* Jan. 2000, pp. 163-169.

Rex, N.B. et al., "Lasing in GaN Micropillar Cavities of N-Polygons: Polygonal Modes and Increased Directionality," *OSA* Sep. 28, 1999.

Chang, S. et al., "Laser Emission From Deformed Microcavities: Chaotic and Regular Orbits," *OSA* Oct. 7, 1998.

Chang, R. K. et al., "Stimulated Emission Within a Nonspherical Microcavity," *OSA* Oct. 16, 1998.

Levi, A.F.J. et al., "Directional Light Coupling from Microdisk Lasers," *Appl. Phys. Lett.* 62 (6) (1993), pp. 561-563.

Sakai, A. et al., "FDTD Simulation of Photonic Devices and Circuits Based on Circular and Fan-Shaped Microdisks," *J. Lightwave Tech.* 17 (8) (Aug. 1999), pp. 1493-1499.

McCall, S.L. et al., "Whispering-Gallery Mode Microdisk Lasers," *Appl. Phys. Lett*, 60, pp. 289-291, (Jan. 1992).

Levi, A.F.J. et al., "Room-Temperature Lasing Action in $In_{0.51}Ga_{0.49}P/In_{0.2}Ga_{0.8}As$ Microcylinder Laser Diodes," *Appl. Phys. Lett.*, 62 (17), Apr. 1993, pp. 2021-2023.

Chern, G. D. et al., "Unidirectional lasing from InGaN multiple-quantum-well spiral-shaped micropillars," Applied Phsics Leter, American Institute of Phics, vol. 83, No. 9, Sep. 1, 2003, pp. 1710-1712.

Choi, S. J. et al., "Fabrication of Vertically Coupled InP Microdisk Resonators by Using Smooth, $CH_4$-based Reactive Ion Etching Methods," Annual Meeting of the IEEE Lasers & Electro-Optics Society, Vo. 1 of 2, Nov. 14, 2001, pp. 628-629.

\* cited by examiner

FIG. 11
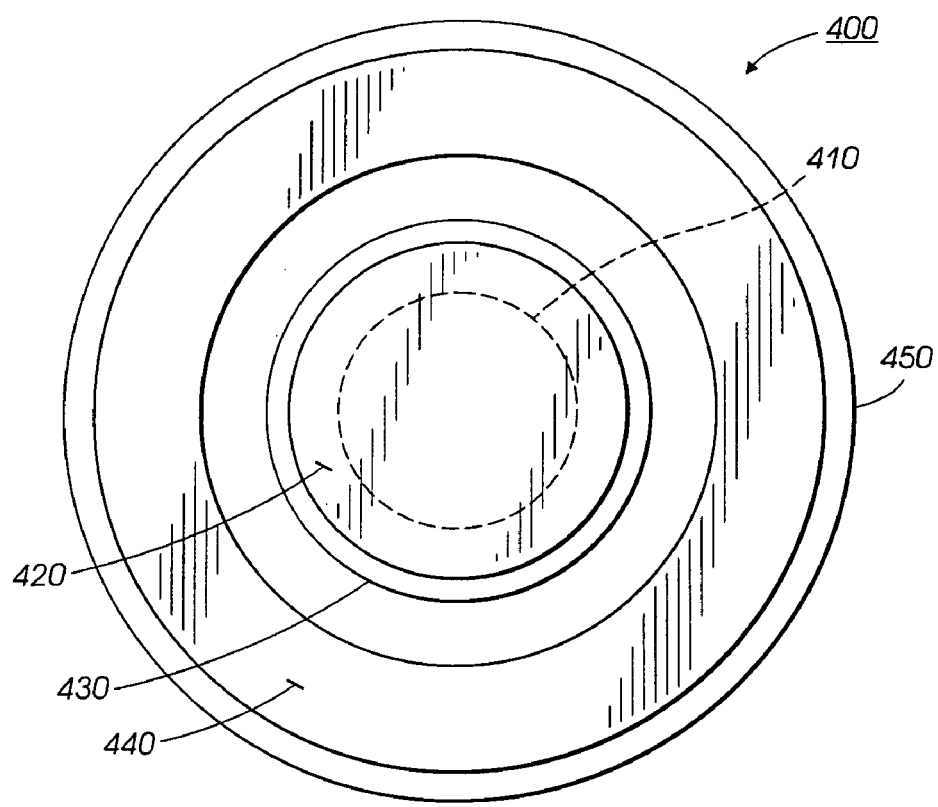
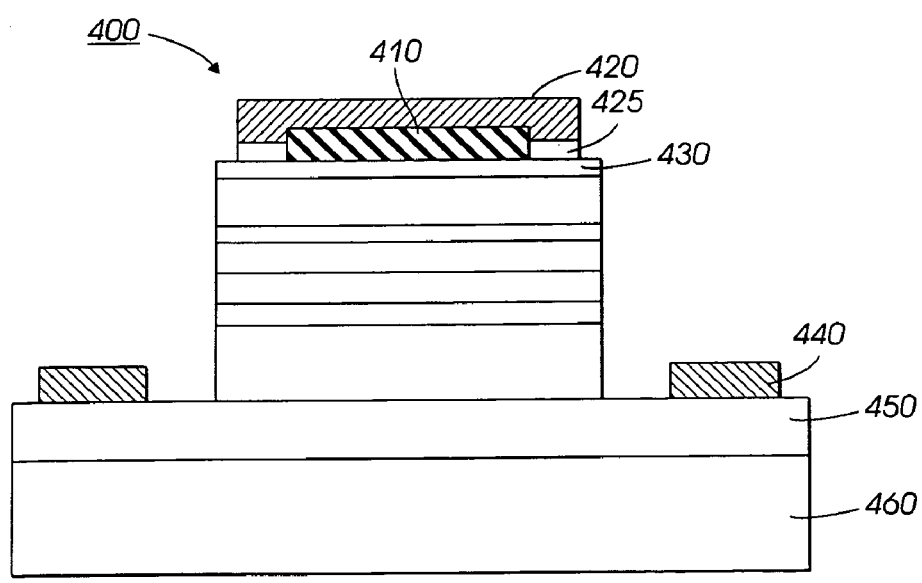
FIG. 12

GRATING-OUTCOUPLED CAVITY RESONATOR HAVING UNI-DIRECTIONAL EMISSION

This invention was made with U.S. Government support awarded by the Defense Advance Research Projects Agency (DARPA). The U.S. Government has certain rights in this invention, including the right in limited circumstances to require the patent owner to license others on reasonable terms as provided for by the terms of Contract No. N66001-02-C-8017.

BACKGROUND OF THE INVENTION

1. Field of Invention

This invention is directed to cavity resonators and optical devices involving cavity resonators as a component.

2. Description of Related Art

Cavity resonators are components in optical devices such as lasers, filters, modulators, converters and light-emitting diodes. An important class of cavity resonators are dielectric cavity resonators, which have been used to make dielectric cavity lasers, filters and other devices. Dielectric cavity lasers operate by providing feedback to an optical gain medium, by total internal reflection at a dielectric interface forming the walls of the resonator bounding the gain medium. Well-known examples are disk and cylinder lasers that emit from whispering gallery modes that circulate around the perimeter of the cavity. Disk and cylinder lasers have been proposed and fabricated in which a laser diode structure is formed with a circular cross-section. The larger the diameter of the circular resonator, the less evanescent leakage there is from whispering gallery modes, which effectively increases the reflectivity of the sidewalls and increases the Q of the resonator. Therefore, large diameter circular disk and cylinder lasers have a relatively large gain×length product, and are capable of exceedingly low threshold currents.

One of the disadvantages of circular dielectric cavity lasers is that light output only occurs through near-field evanescent leakage through the side walls. This occurs because the incidence angle of the light on the walls is above the critical angle for total internal reflection. Therefore, coupling light into or out of the resonator is accomplished primarily by near-field coupling. Consequently, an input or output fiber has to be placed sufficiently close to the resonator that the evanescent fields that link the optical regions of the dielectric cavity laser and the fiber are appreciable. Therefore, positioning the input/output fiber with respect to the resonator has to be carefully controlled and the output power tends to be low.

Another disadvantage of circular dielectric cavity lasers is that the laser emission is isotropic. That is, light is emitted from the circular dielectric cavity laser equally from all circumferential positions, i.e., equally along all 360° of the outer surface of the circular dielectric cavity laser. As a result, the light output from circular dielectric cavity lasers cannot be focused by the usual optics and injected into, for example, a fiber optic cable without large losses. For these reasons, there are few applications for circular dielectric cavity lasers.

A number of alternative dielectric cavity laser designs attempting to localize the output of a dielectric cavity laser into well-defined directions have been proposed. One such alternative design is referred to as an asymmetric resonant cavity laser. The asymmetric resonant cavity laser is a dielectric cavity laser with a cross-section smoothly deformed from circular symmetry. Such lasers can emit from either deformed whispering gallery modes or from librational modes such as the bow-tie mode.

FIG. 1 shows one exemplary embodiment of an asymmetric resonant cavity laser, which emits from the points of maximum curvature 11 and 13 located near the poles 10 and 12 of the cavity. The asymmetric resonant cavity laser shown in FIG. 1 has two degenerate directions in which the whispering gallery modes can circulate, clockwise or counterclockwise. The asymmetric resonant cavity laser can be fed by a waveguide 14 located on the top of the device. As shown in FIG. 1, the waveguide 14 couples an optical signal λ into the asymmetric resonant cavity laser, into the clockwise circulating whispering gallery mode. The asymmetric resonant cavity laser outputs the light 20 along a tangent to the point of maximum curvature 13, into an output fiber 16, at the point of maximum curvature 13. The device may also output some of the generated light back into the input fiber 14, as the asymmetric resonant cavity laser generally outputs at least two emitted beams 18 and 20, each emitted along the tangent lines at each point of maximum curvature 11 and 13.

Another embodiment of an asymmetric resonant cavity optical device is the librational mode semiconductor laser, which emits from a bow-tie mode that does not circulate around the periphery. The boundary of this laser resonator is smooth and the beams are not outcoupled by a local perturbation. This laser has high output power and directional emission but produces four output beams.

Another class of lasers is the vertical cavity surface emitting laser diode (VCSEL). In a VCSEL structure, the optical feedback is provided by a pair of distributed Bragg reflector (DBR) mirror stacks located on top and bottom of the active region. The distributed Bragg reflector mirror stacks form a cavity perpendicular to the semiconductor layer. This vertical resonator provides an output beam normal to the surface of the semiconductor layers. However, there are a number of drawbacks associated with such a VCSEL approach. Because the cavity is oriented in the vertical direction, the effective cavity length is the thickness of the multi-quantum well active region, which is only a few tens of nm. Therefore, highly reflective mirrors (reflectivity greater than 99.9%) are required to increase the effective gain×length product. In some material systems, there may be no feasible way to achieve the required reflectivity. In addition, the output power of VCSELs is comparatively small, because of the small gain×length product. However, VCSELs also provide a number of advantages, such as fabrication in two-dimensional arrays, wafer level device testing, single longitudinal mode operation, and improved coupling to optical fibers.

SUMMARY OF THE INVENTION

Multi-directional emissions such as those produced by asymmetric resonant cavities are undesirable for a number of reasons, including low beam intensity, because the output modes are shared by the emitted beams. For a variety of applications, multi-directional emission is inappropriate. Accordingly, a dielectric cavity laser having fewer emitted beams would be useful.

This invention provides dielectric microcavity disk resonators having one or more localized grating regions implemented in the plane of the disk resonator. Here, the term "in the plane of the resonator" means generally aligned or parallel to the flat surface of the disk. In fact, the grating regions need be aligned to the flat surface of the disk only enough that the grating regions operate to outcouple light from the disk resonators as described herein. Thus, no particular degree of alignment or paralellism is required so long as the grating regions outcouple light as described herein. In various exemplary embodiments, the grating region is located near the circumference of the cavity. In various exemplary embodiments, the grating region outputs a beam substantially out of the plane of the resonator.

This invention separately provides a nearly circular resonant cavity, wherein whispering gallery modes are outcoupled by a second-order grating fabricated in the cladding layer of the semiconductor structure.

This invention separately provides a nearly circular resonant cavity, wherein whispering gallery modes are outcoupled by a second-order grating fabricated on the top surface of the semiconductor structure.

This invention separately provides grating-outcoupled cavity resonators having one or more localized grating regions that symmetrically outcouple the circulating clockwise and counterclockwise modes to obtain directional emission of both modes, at an angle out of the plane.

This invention further provides outcoupled cavity resonators that use a second-order grating to obtain directional emission that is substantially orthogonal to the plane of the resonator structure.

In various exemplary embodiments, a grating-outcoupled cavity resonator according to this invention is formed by providing a localized periodic variation in the index of refraction along the circumference of the grating-outcoupled cavity resonator. The periodic variation can be in the form of a sawtooth, sinusoidal, or trapezoidal topography etched into the waveguide layer and overgrown by the cladding layer of the resonator. In some exemplary embodiments, the features of the grating may also be asymmetric in shape, such as, for example, by being "blazed" to favor the outcoupling of clockwise or counterclockwise modes. In some exemplary embodiments, the periodic variations are in the form of a set of parallel pillars etched into the cladding layer.

In various other exemplary embodiments, the periodic variation can be in the form of a set of metal or conductive oxide gratings deposited on top of the cladding or contact layer. A periodic variation in the index of refraction along the circumference can also be realized by ion implantation, and/or in- or out-diffusion of materials.

In various exemplary embodiments, the grating can extend over the entire circumference of the microdisk resonator to achieve maximum output power. In various exemplary embodiments, the grating is chirped, i.e., the grating period varies slightly over the region of the grating, to broaden the spectral width of the outcoupled light and increase its intensity. In some exemplary embodiments, the grating is formed in patterns that allow shaping of the outcoupled beam.

In various other exemplary embodiments, two or more laser cavities of different radii are concentric, so that there are two or more gratings, each on top of and adjacent to the next. Each grating may have a different grating period, matched to the lasing wavelength of the laser cavity. Therefore, the multi-frequency output device can output two or more closely spaced laser beams of the same or different wavelength.

In various other exemplary embodiments, a first-order grating region is formed with features disposed at an angle to the circulating modes, in order to diffract the light into a radial direction from the cavity resonator.

Because the light amplification in the grating-outcoupled microcavity disk resonators according to this invention occurs in the plane of the laser resonator, the gain×length product is very large. As a result, high output levels can be achieved. The outcoupling through a grating region, such as, for example, a second-order distributed feedback (DFB) grating implemented in the plane of the resonator, allows surface emission and all the advantages associated with such surface emission. Since the amplification process takes place in the plane of the resonator, while the outcoupling is accomplished by a grating region, the design and performance of the laser cavity is basically independent of the design of the output coupler, and outcoupling efficiency can be tuned over a wide range without affecting other laser parameters. For example, the grating outcoupled microdisk resonator would be less sensitive to temperature variation than a VCSEL. A distributed feedback grating, if used, is also much easier to fabricate than dielectric distributed Bragg reflector mirror stacks and is almost independent of the material system.

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of the devices, systems, and/or methods according to this invention will be described in detail, with reference to the following figures, wherein:

FIG. 11 is a top view of the first exemplary embodiment of the grating-outcoupled microcavity disk resonator according to this invention, showing the structure of the electrodes for pumping the device;

FIG. 12 shows a cross-sectional view of the first embodiment of the grating-outcoupled microcavity disk resonator according to this invention, showing the structure of the electrodes;

DETAILED DESCRIPTION OF EXEMPLARY EMBODIMENTS

Figure 1:
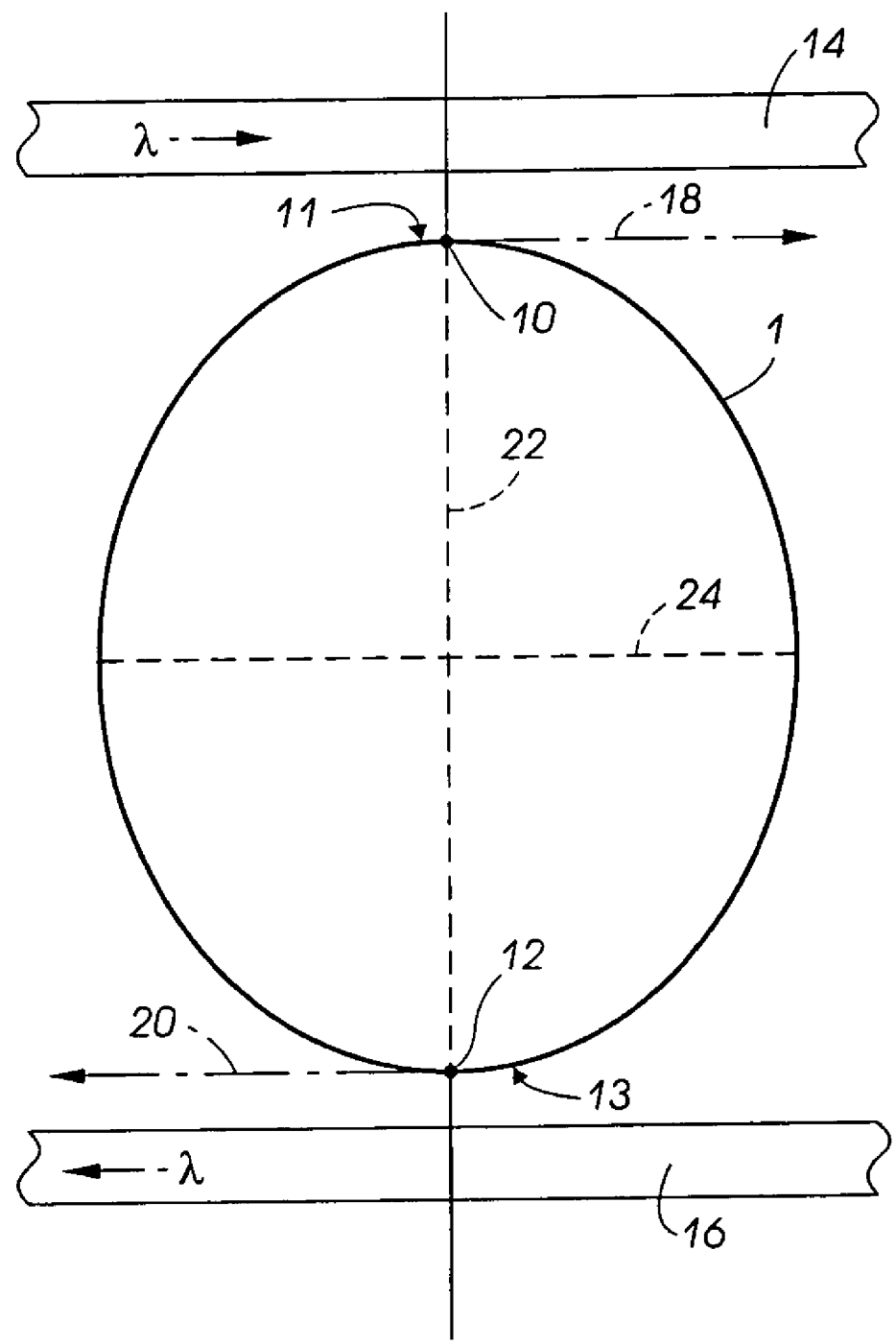
FIG. 1 is a simplified schematic diagram of a known asymmetric resonant microcavity disk resonator structure.

FIG. 1 shows a known embodiment of an asymmetric resonant cavity 1, wherein two axes of discrete symmetry 22 and 24 remain in the shape of the non-circular resonator 1. Because of the quadrupolar shape of the asymmetric resonant cavity 1, there is a point of maximum curvature 11 and 13 at each pole 10 and 12, respectively. Modes circulating in both the counterclockwise and clockwise directions in the asymmetric resonant cavity 1 are low loss, and therefore high gain. Because of the discrete symmetry of the asymmetric resonant cavity 1, the clockwise and counterclockwise modes are degenerate, and each mode will output one beam at each point of maximum curvature 11 and 13. Therefore, if this asymmetric resonant cavity 1 were to be electrically pumped, four output beams would be produced, one for each circulating mode, for each point of maximum curvature 11 and 13. Therefore, this non-circular resonator 1 is not uni-directional, in that at least four output beams are produced when the modes are electrically pumped.

Figure 2:
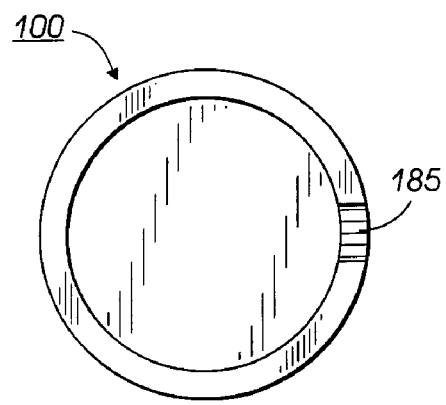
FIG. 2 shows a top view of a first embodiment of a grating-outcoupled microcavity disk resonator according to this invention.

In contrast to the known embodiment shown in FIG. 1, which outcouples light in evanescent waves by providing areas of high curvature in the side walls of the device, in various exemplary embodiments of a laser structure according to this invention, light can also be outcoupled by providing a grating structure in the plane of the cavity resonator, which outcouples light by diffraction of the circulating modes. FIG. 2 shows a top view of one exemplary embodiment of such a grating-outcoupled cavity resonator 100 according to this invention. As shown in FIG. 2, a nearly-circular grating-outcoupled cavity resonator 100 is formed on a substrate, with a grating region 185 along a portion of the periphery of the grating outcoupled cavity resonator 100. The light diffracted by the grating region 185 exits the resonator 100 in a direction normal to the plane of the device.

Various exemplary embodiments of the grating-outcoupled cavity resonator according to this invention, as described herein, have at least one region of periodic variation in index of refraction usable to outcouple circulating light. For example, in some exemplary embodiments, such regions effectively form a second-order distributed feedback (DFB) grating. The grating region 185 shown in FIG. 2 is a region of periodic variation in the index of refraction which has been disposed in the plane of the resonator.

Figure 3:
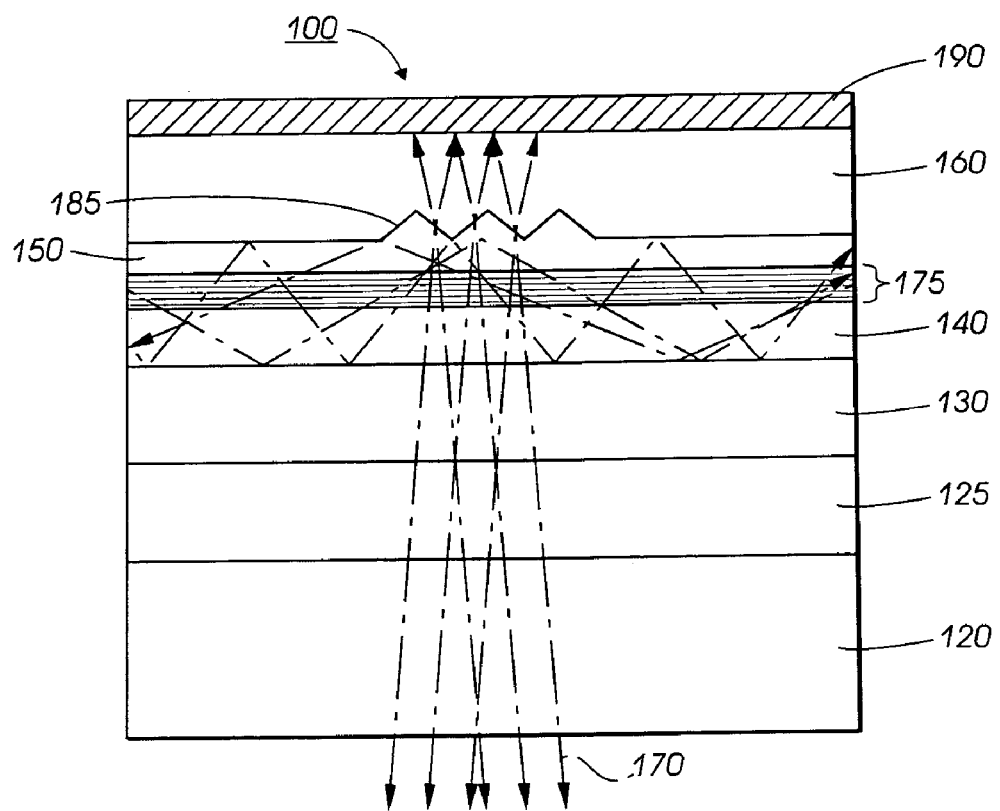
FIG. 3 is a side view of the first exemplary embodiment of the grating-outcoupled microcavity disk resonator of FIG. 2 according to this invention.

FIG. 3 shows a simplified side view of the grating region 185 and illustrates the interaction of the grating region 185 with the circulating modes in the grating-outcoupled microcavity disk resonator 100. As shown in FIG. 3, a buffer layer 125 is deposited on or over a substrate 120. A lower cladding layer 130 is formed on or over the buffer layer 120. A lower waveguide layer 140 is formed on or over the lower cladding layer 130. An active region 175 is formed on or over the lower waveguidelayer 140. An upper waveguide layer 150 is formed on or over the active region 175, and an upper cladding layer 160 is formed on or over the upper waveguide layer 150. A metal contact layer 190 is formed on or over the upper cladding layer 160.

Figure 4:
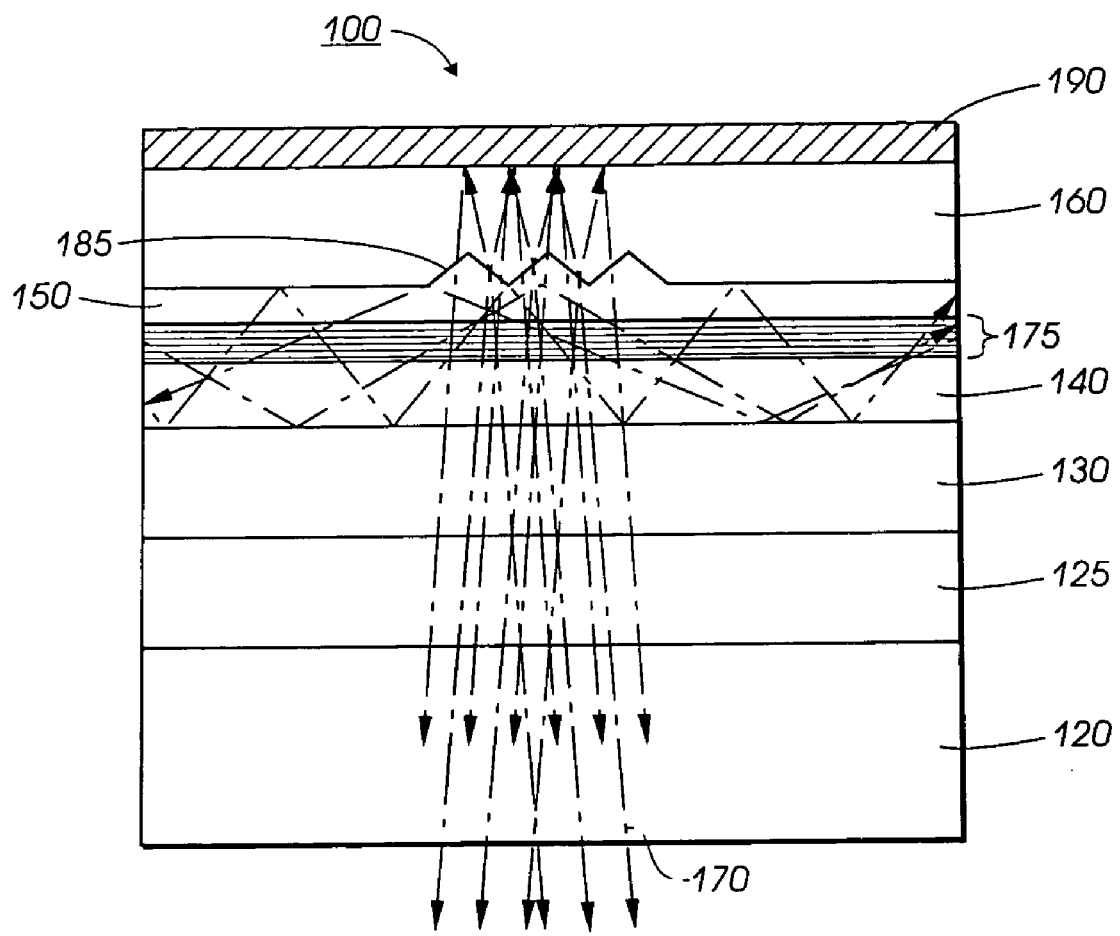
FIG. 4 is a second embodiment of the grating-outcoupled microcavity disk resonator, including a reflective material deposited as the metal contact.
Figure 5:
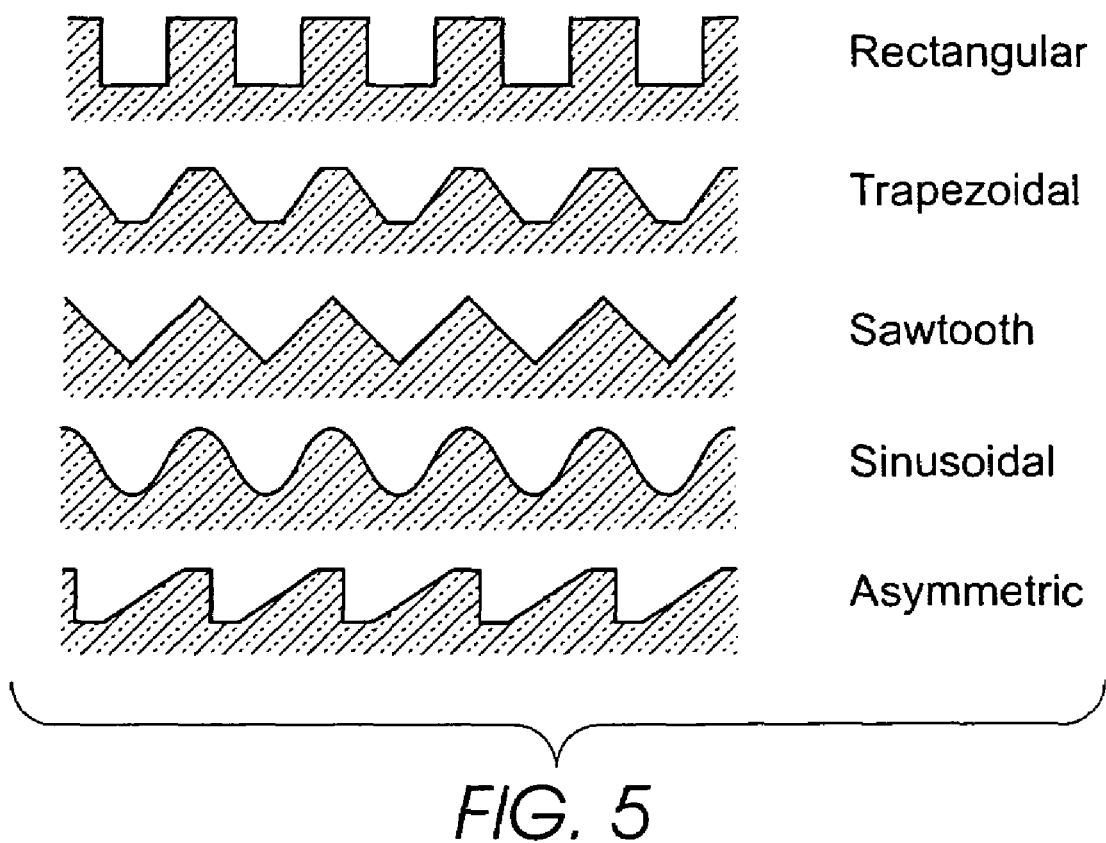
FIG. 5 is a side view of alternative designs for the grating teeth of the grating-outcoupled microcavity disk resonator.

As shown in FIG. 4, in various exemplary embodiments, the contact layer 190 is reflective to redirect light emitted in an upward direction into a downward direction. While a sawtooth topography is shown in the first exemplary embodiment shown in FIGS. 3 and 4, a sawtooth topography is only one example for the shape of the "grating" features, and other shapes may be used. It should be appreciated that, in general, any technique that is able to create a periodic variation in the complex effective index of refraction can be used to create the "grating" according to this invention. Examples of such alternative geometries are shown in FIG. 5, which shows rectangular, trapezoidal, sinusoidal, and asymmetric geometries, which can be used instead of, or in addition to, the sawtooth pattern shown in FIGS. 3 and 4.

The shape of the grating teeth may be determined by the fabrication method. For example, it is very difficult to etch grating teeth with exactly vertical side walls, because the etching process and the photoresist patterning process often form a side wall with a natural inclination, such as a tilt or an etch pattern which has an overall sinusoidal shape. Therefore, the grating teeth may have a trapezoidal or sinusoidal shape, as shown in FIG. 5.

The "grating" may also be asymmetric in shape, to form a "blazed" grating, which interacts asymmetrically with the clockwise propagating whispering gallery mode compared to the counterclockwise propagating whispering gallery mode. Although, in general, a symmetric interaction with the clockwise and counterclockwise modes is desirable to efficiently outcouple both of the clockwise and counterclockwise modes, there may be applications for which the asymmetric grating shown in FIG. 5, is more appropriate.

In various exemplary embodiments, a second-order distributed feedback grating is used to couple the laser light out in a direction that is generally perpendicular to the resonator plane. The periodicity $\Lambda$ of a second-order distributed feedback grating is:

$$\Lambda = \lambda/n$$

where:

$\lambda$ is the outcoupling wavelength; and n is the effective refractive index in the laser cavity.

It should be appreciated that this relationship is an approximation which is reasonable when the differences between the effective refractive indices are small. If the differences between the effective refractive indices are large, a more accurate definition of the periodicity is:

$$\Lambda = \Lambda_1 + \Lambda_2 = \lambda/(2*n_1) + \lambda/(2*n_2),$$

where $n_1$ and $n_2$ are the effective refractive indices in the respective distributed feedback grating regions. This is shown in greater detail in FIG. 8.

Higher-order distributed feedback gratings can also be used to couple the laser light into a direction out of the plane of the resonator. However, it should be appreciated that, in such higher-order distributed feedback gratings, the outcoupling directions are not necessarily perpendicular to the surface. For example, in a third order grating, where the periodicity $\Lambda$ is:

$$\Lambda = 3 * \lambda/(2*n)$$

the light that is outcoupled will be emitted along lines that lie at 70 degrees and 110 degrees to the plane of the resonator. It is also possible to use even higher-order distributed feedback gratings. The periodicity $\Lambda$ of an N-th order grating is:

$$\Lambda = N*\lambda/(2*n).$$

Gratings can also be chirped, where the period varies slightly to broaden the grating spectrum, by sacrificing the peak reflectivity.

It should be appreciated that, when diffracting light out of the resonator, the periodicity of the grating is often the most significant parameter. However, the shape of the grating will also affect the coupling coefficient. Typically, however, the effect of the grating shape on the coupling coefficient is relatively small. For example, the coupling coefficient is only about 27% higher for a rectangular-shaped grating than for a sinusoidal pattern. Similarly, a sawtooth topography has a 19% smaller coupling coefficient compared to a sinusoidal pattern. The coupling coefficient for a graded pattern is in between the sawtooth and the rectangular pattern. Other parameters, such as the depth of the grating teeth and the refractive index difference in the grating profile, can also have a strong influence on the coupling coefficient.

Whispering gallery modes circulating around the periphery of the device encounter the periodic variation in the index of refraction, formed, for example, by the periodic grating structure 185 implemented in the upper waveguide layer 150 and upper cladding layer 160 of the resonator 100 shown in FIG. 3. Photons generated in the active region 175 are guided between the upper waveguide layer 150 and the lower waveguide layer 140. Photons guided by the upper waveguide layer 150 interact with the periodic structure 185 and are diffracted at the interface between the upper waveguide layer 150 and the upper cladding layer 160 due to the periodic structure 185. The diffraction causes the photons to be emitted along a direction 170 that is substantially orthogonal to the plane of the resonator 100.

As discussed above in FIGS. 3 and 4, the periodic variation 185 may be in the form of sawtooth topography formed between the upper cladding layer 160 and the waveguide layer 150. The periodic pattern 185 is formed by etching depressions into the waveguide layer 150. The cladding layer 160 is then grown or regrown over the periodic topography 185 formed in the waveguide layer 150. The cladding layer 160 is then capped with a continuous film 190 of conductive electrode material, which provides the carriers that recombine in the quantum well active region 175.

Each region 185 of periodic variation in the index of refraction acts as an outcoupling aperture. That is, the various exemplary embodiments of grating-outcoupled cavity resonators disclosed herein have one or more outcoupling gratings 185 that each couples to one or both of the clockwise and counterclockwise propagating modes. For a second-order grating, the resonator 100 is therefore capable of emitting a beam in both directions perpendicular to the surface, that is, +/−90 degrees, from each grating region 185. Accordingly, two beams will be produced from the resonator 100 at each outcoupling grating 185, resulting in surface emission from the resonator at each outcoupling grating 185.

In various exemplary embodiments, the output grating 185 may be formed only in the top waveguide layer 150. In other exemplary embodiments, an output grating 185 may be provided in the bottom waveguide layer 140. In other exemplary embodiments, an output grating 185 may be provided both in the top waveguide layer 150 and in the bottom waveguide layer 140. For a second-order grating, each grating region 185 will produce two surface-emitted output beams, one directed upward and the other directed downward. One such output grating 185 may further include a reflective surface that reflects the beam(s) along one direction into the other direction, as shown in FIG. 4, where the upward-directed beam(s) are reflected so that they are ultimately emitted from the bottom surface of the device along the downward direction.

If the distance d between the output grating 185 and the metal reflector 190 is a multiple of $\lambda/2n$, where n is the refractive index in the laser structure and $\lambda$ is the wavelength of the light traveling in the disk resonator, the reflected light and the unreflected light from the grating will constructively interfere. Therefore, the total light output of the laser diode will be enhanced. It should be appreciated that the reflective surface may impart a phase shift to the beam. In that case, this phase shift must be taken into account when determining the proper distance d between the grating region 185 and the reflective layer, to achieve constructive superposition of the reflected and diffracted waves.

Figure 6:
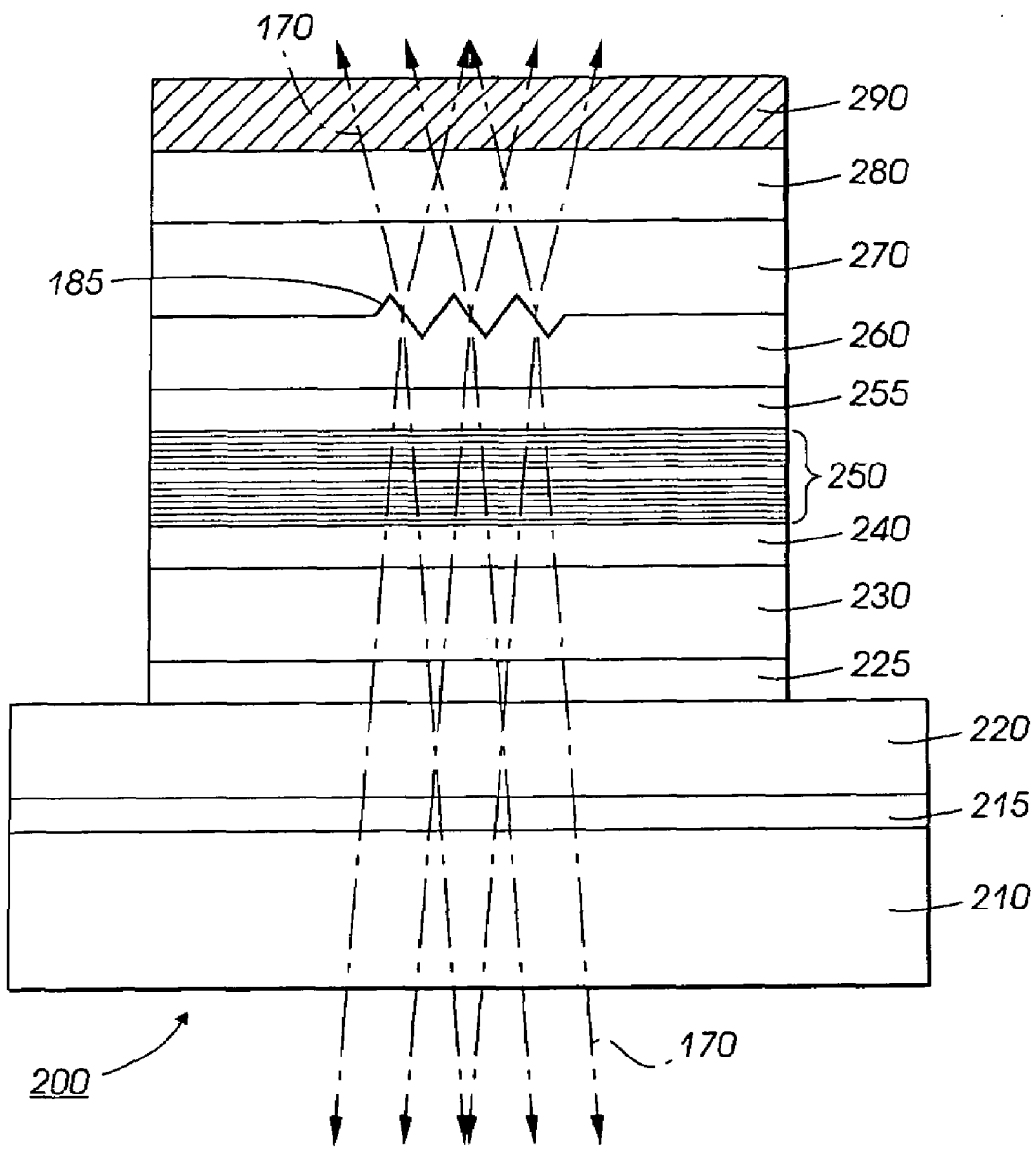
FIG. 6 is a cross-sectional view of a first exemplary embodiment of the layer structure of a grating-outcoupled microcavity disk resonator according to this invention.

The structure of the light-emitting device or resonator 100 itself may be a III-V nitride laser heterostructure. Such devices are known to lase in the blue-to-ultraviolet portion of the spectrum, and are expected, in the future, to be able to lase in adjacent portions of the spectrum. FIG. 6 shows one exemplary embodiment of the full cross-sectional structure of a III-V nitride laser device 200 usable as the grating-outcoupled cavity resonator 100 according to this invention. The layer structure may be fabricated using metal-organic chemical vapor deposition (MOCVD). The III-V nitride laser device 200 shown in FIG. 6 is grown on a C-face (0001) or A-face (1120) oriented sapphire ($Al_2O_3$) substrate 210 on which a succession of semiconductor layers is epitaxially deposited. Other possible substrate materials include, for example, silicon carbide (e.g., 6H—SiC or 4H—SiC), GaN, AlGaN, AlN or silicon.

The laser structure 200 includes a thin buffer layer 215, also known as a nucleation layer, formed on or over the sapphire substrate 210. The buffer layer 215 acts primarily as a wetting layer, to provide smooth, uniform coverage of the top surface of the sapphire substrate 210. Typically, the buffer layer 215 is formed of a binary or ternary III-V nitride material, such as, for example, GaN, AlN, InGaN or AlGaN. In various exemplary embodiments, the buffer layer 215 may have a thickness of from about 10 nm to about 30 nm and is typically undoped.

A second III-V nitride layer 220 is formed on or over the substrate 210, and the buffer layer 215, if provided The second III-V nitride layer 220 is an n-type (Al)(In)GaN current spreading layer. The second III-V nitride layer 220 acts as a lateral n-contact. In various exemplary embodiments, the second III-V nitride layer 220 is n-type GaN:Si or AlGaN:Si with an n-doping concentration in the range of $10^{16}$ to $10^{20}$ cm$^{-3}$. In various exemplary embodiments, the doping concentration is $5\times10^{18}$ cm$^{-3}$. In such exemplary embodiments, the second III-V nitride layer 220 has a thickness of from about 1 μm to about 10 μm.

A third III-V nitride layer 225 may be formed on or over the second III-V nitride layer 220. The third III-V nitride layer 225, if used, is a strain compensation and defect reducing layer. In various exemplary embodiments, the third III-V nitride layer 225 is an n-type InGaN:Si with an In content smaller than the InGaN quantum well(s) in the active region 250 and with an n-doping concentration of $10^{16}$ to $10^{20}$ cm$^{-3}$. In various exemplary embodiments, the doping concentration is $5\times10^{18}$ cm$^{-3}$. In such exemplary embodiments, the third III-V nitride layer 225 may have a thickness of from about 25 nm to about 200 nm.

A fourth III-V nitride layer 230 is formed on or over the third III-V nitride layer 225, if used, or on or over the second layer 220, if not. The fourth III-V nitride layer 230 is a cladding layer. In various exemplary embodiments, the layer 230 is an n-type (In)AlGaN cladding layer. The fourth III-V nitride layer 230 is typically n-type AlGaN:Si with an Al content larger than the fifth III-V nitride layer 240 and with a n-doping concentration of about $10^{16}$ to about $10^{20}$ cm$^{-3}$. In various exemplary embodiments, the doping concentration is about $1\times10^{18}$ cm$^{-3}$. In such exemplary embodiments, the fourth III-V nitride layer 230 has a thickness of from about 0.2 μm to about 2 μm.

A fifth III-V nitride layer 240, which is a waveguide layer, is formed on or over the fourth III-V nitride layer. In various exemplary embodiments, the fifth III-V nitride layer 240 is n-type (In)GaN:Si or (In)GaN:undoped or AlGaN or AlGaInN with the In and Al content chosen such that the refractive index is larger than that of the fourth III-V nitride layer 230 and smaller than that of the InGaN quantum well(s) that form an active region 250. In various exemplary embodiments, the thickness of the fifth III-V nitride layer 240 is from about 0.05 μm to about 0.2 μm and has an n-doping concentration of about $10^{16}$ to about $10^{20}$ cm$^{-3}$. In various exemplary embodiments, the doping concentration is about $1\times10^{17}$ cm$^{-3}$.

As indicated above, the quantum well active layer 250 is formed on or over the fifth III-V nitride layer 240. In various exemplary embodiments, the quantum well active layer is formed using at least one (In)(Al)GaN quantum well. In various exemplary embodiments, for a quantum well active layer 250 having multiple-quantum well active regions, the individual quantum wells may have a thickness of from about 10 Å to about 200 Å. In various exemplary embodiments, the individual quantum wells are separated by (In)(Al)GaN barriers. In various exemplary embodiments, these barriers have a thickness of from about 10 Å to about 200 Å. The (In)(Al)GaN quantum wells and the (In)(Al)GaN barriers are typically undoped. However, in some exemplary embodiments, the (In)(Al)GaN barriers are Si-doped or partially Si-doped. Typical n-doping concentrations are between about $10^{16}$ to about $10^{20}$ cm$^{-3}$. In various exemplary embodiments, the doping concentration is about $5\times10^{18}$ cm$^{-3}$. It should be appreciated that, in general, the composition of the (In)(Al)GaN quantum wells is chosen such that the band gap energy is smaller than that of the waveguide and cladding layers. One exemplary embodiment of an active region 250 for a laser emitting at 400 nm contains three to five 35 Å-wide InGaN quantum wells, having an indium mole fraction of 8-10%, separated by 65 Å-wide InGaN barriers, having an indium mole fraction of 1-2%.

A sixth III-V nitride layer 255 is formed on or over the quantum well active region 250. The sixth III-V nitride layer acts as a carrier confinement layer. The sixth III-V nitride layer 255 has a higher band gap than the quantum well active region 250. In various exemplary embodiments, the band gap difference is about 0.5 eV. In various exemplary embodiments, the sixth III-V nitride layer 255 is p-type $Al_xGa_{1-x}N$:Mg with an Al mole fraction in the range from x=0.05 to x=0.4. In such exemplary embodiments, the overall thickness of the sixth III-V nitride layer 255 is typically from about 5 nm to about 100 nm and typically has a p-doping concentration of about $10^{18}$ to about $10^{21}$ cm$^{-3}$. In various exemplary embodiments, the doping concentration is about $1\times10^{20}$ cm$^{-3}$.

A seventh III-V nitride layer 260 is formed on or over the sixth III-V nitride layer 255. The seventh III-V nitride layer acts as a waveguide layer. In various exemplary embodiments, the seventh III-V nitride layer 260 is a p-type (In)GaN:Mg, (In)GaN:undoped, AlGaN, or AlGaInN material. In such exemplary embodiments, the In and Al content is chosen such that the refractive index of the seventh layer 260 is larger than that of the sixth III-V nitride layer 255 and is smaller than that of the InGaN quantum well(s) in the active region 250. In various exemplary embodiments, the thickness of the seventh III-V nitride layer 260 is from about 0.05 μm to about 0.2 μm and is undoped or has a p-doping concentration of about $10^{16}$ to about $10^{20}$ cm$^{-3}$. In various exemplary embodiments, the doping concentration is about $1\times10^{18}$ cm$^{-3}$. The sawtooth grating structure 185 shown in FIG. 5 is formed in or applied to a top surface of the seventh III-V nitride waveguide layer 260.

An eighth III-V nitride layer 270 is formed on or over the seventh III-V nitride layer 260. In various exemplary embodiments, the eighth III-V nitride layer 270 is a p-type (In)AlGaN cladding layer, which is grown in and over the sawtooth depressions formed in the waveguide layer 260. In various exemplary embodiments, the eighth III-V nitride layer 270 has a thickness of from about 0.2 μm to about 2 μm. In various exemplary embodiments, the eighth layer 270 is formed using p-type AlGaN:Mg, where the Al content is larger than that of the seventh III-V nitride layer 260. In various exemplary embodiments, the eighth layer 270 has a p-doping concentration of about $10^{16}$ to about $10^{21}$ cm$^{-3}$. In various exemplary embodiments, the doping concentration is about $5\times10^{19}$ cm$^{-3}$.

A ninth III-V nitride layer 280 is formed on or over the eighth III-V nitride layer 270. The ninth III-V nitride layer 280 forms a p-doped GaN:Mg or p-doped InGaN:Mg contact layer 280 for a low-resistance metal electrode. In various exemplary embodiments, the ninth III-V nitride layer 280 has a thickness of from about 5 nm to 200 nm. The ninth layer 280 has a p-doping concentration of about $10^{16}$ to about $10^{21}$ cm$^{-3}$. In various exemplary embodiments, the doping concentration is about $1\times10^{20}$ cm$^{-3}$. The structure may be capped by a layer of metal electrode material 290. The material choices for the p-metal include, but are not limited to, for example, nickel (Ni), palladium (Pd), platinum (Pt), a nickel-gold alloy (Ni/Au), a palladium/titanium/gold alloy (Pd/Ti/Au), or a platinum/titanium/gold alloy (Pt/Ti/Au).

In various exemplary embodiments, the sapphire substrate wafers used to form the substrate 210 are of standard specifications including an epitaxial polish on one side and a typical thickness of 0.25 mm to 0.43 mm (10 mil to 17 mil). In the case of nitride resonators grown on transparent sapphire, GaN, AlN or SiC substrates, the outcoupling can occur through the transparent substrate. For other systems with non-transparent substrates, the outcoupling can be achieved through a semi-transparent top electrode. If alternative substrate materials are used, such as, for example, GaN or AlN, the second III-V nitride layer 220 can be directly formed on top of the substrate without the nucleation layer 215. The substrate temperatures during growth are typically 550° C. for the GaN nucleation layer, 1000° C. to 1100° C. for the GaN and AlGaN layers and 700° C. to 900° C. for the InGaN or InAlGaN layers. In addition, the reactor pressure may be controlled between 50 Torr and 740 Torr. As organometallic precursors for the MOCVD growth, TMGa (trimethylgallium), TMAl (trimethylaluminum), TMIn (trimethylindium) and TEGa (triethylgallium) are used for the group III elements and NH$_3$ (ammonia) is used as the nitrogen source. Hydrogen and/or nitrogen are used as carrier gases for the organometallic precursor gases. For the n-doping, 100 ppm SiH$_4$ is diluted in H$_2$, and for the p-doping, Cp$_2$Mg (cyclopentadienylmagnesium) is used. Other examples of p-type dopants include, but are not limited to Ca, C and Be. Examples of n-type dopants include, but are not limited to, Si, O, Se, and Te. In various exemplary embodiments, the overall height of the structure is about 1.5 to about 2.5 microns.

Besides group III nitride semiconductors, a number of other materials can be used to realize grating-outcoupled microcavity disk resonator devices according to this invention. These other materials include other III-V compound semiconductors, for example, GaAs, InAs, AlAs, including InGaAs, AlGaAs, and InAlAs alloys, InP, AlP, and GaP, including InGaAsP, InGaP and InAlP alloys. These other materials also include II-VI compound semiconductors, such as, for example, ZnSe, CdS, MgS, MgSe, CdSe, CdTe, ZnO, MgO and alloys of and/or between these materials. These other materials also include organic materials, such as, for example, light emitting polymers or light emitting small molecules. In general, any material that can be electrically or optically pumped to produce gain can be used to form the grating-outcoupled cavity resonators according to this invention.

Figure 7:
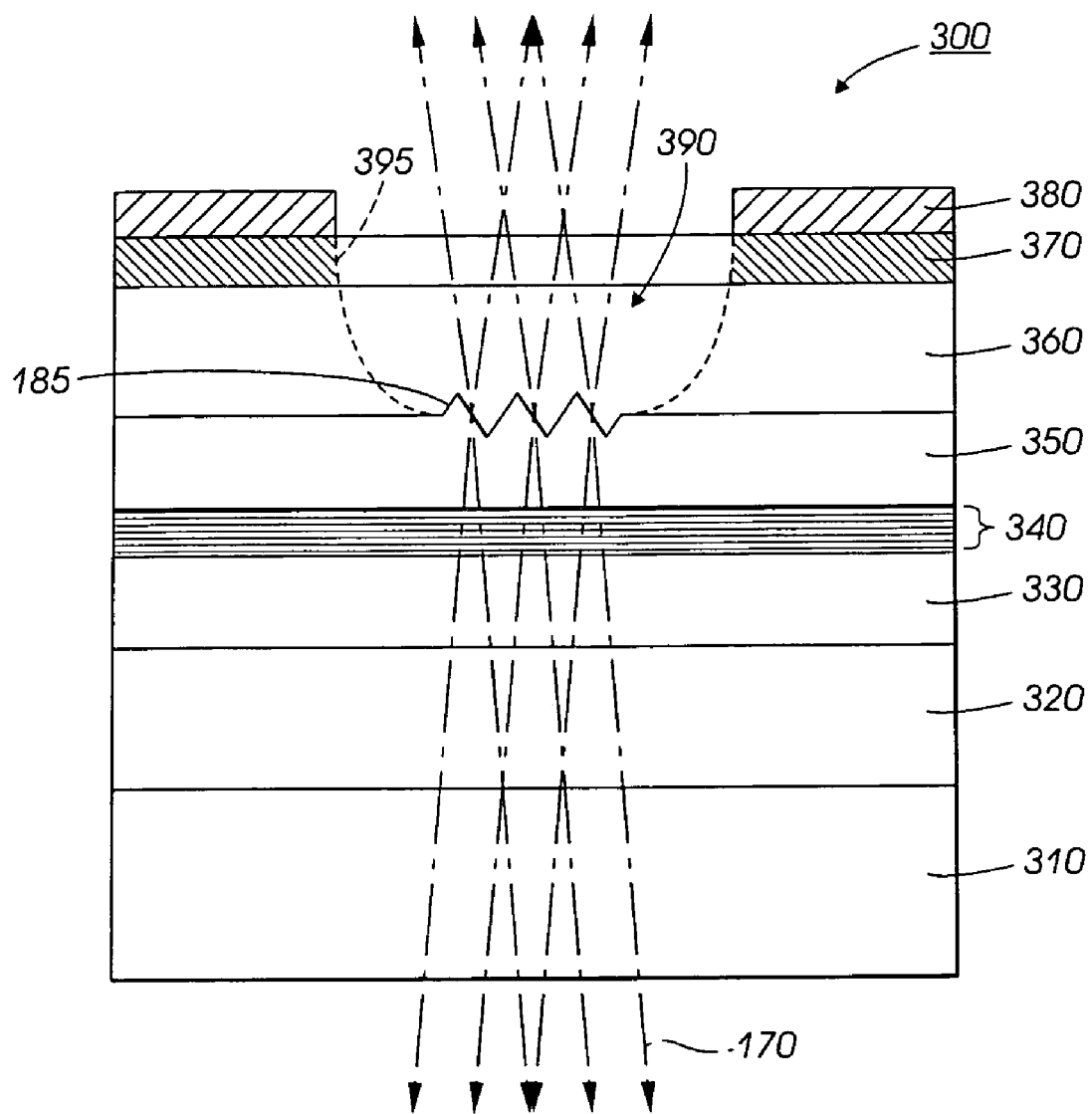
FIG. 7 is a cross-sectional view of a second exemplary embodiment of the layer structure of a grating-outcoupled microcavity disk resonator according to this invention.

FIG. 7 shows one exemplary embodiment of a GaAs-based grating-outcoupled cavity resonator 300. As shown in FIG. 7, a lower cladding layer 320 is deposited on or over a substrate 310. The lower waveguide layer 330 is deposited on or over a lower cladding layer 320. An active region 340 containing the quantum wells is formed on or over the lower waveguide layer 330. An upper waveguide layer 350 is formed on or over the active region 340. An upper cladding layer 360 is formed on or over, and covers, the upper waveguide layer 350. One or more metal electrode layers 370 and 380 may be formed on or over the upper cladding layer 360.

The optical and current confinement structure of this GaAs-based grating-outcoupled cavity resonator 300 is very similar to the design for the GaN-based grating-outcoupled cavity resonator 200 structure shown in FIG. 6. In the case of GaAs, the structure 300 can be grown on a GaAs conducting substrate 310. In various exemplary embodiments, the active region 340 is an InGaAs single quantum well or an InGaAs/GaAs multi-quantum well. Depending on the indium content of the InGaAs quantum well, the emission wavelength will be in the range between about 850 nm and about 1200 nm. If an AlGaAs or InAlGaAs single quantum well or multi-quantum well active region 340 is used, the emission wavelength can be shorter, such as, for example, about 850 nm to about 700 nm.

Optical and electrical confinement is achieved with a separate confinement heterostructure comprising undoped Al$_{0.4}$Ga$_{0.6}$As waveguide layers 330 and 350 and Si- and C-doped Al$_{0.75}$Ga$_{0.25}$As cladding layers 320 and 360. The sawtooth grating structure 185 is formed in or applied to the upper waveguide layer 350 and the cladding layer 360. Since GaAs and AlAs have almost the same lattice constant, the cladding layers 320 and 360 and the waveguide layers 330 and 350 can be grown much thicker and with much higher aluminum concentrations, compared to the AlGaN cladding layers 230 and 270 in the GaN-based structure 200 shown in FIG. 6.

Additionally, GaAs-based laser structures do not normally require the current confinement layer used in GaN-based devices, because of the larger band offset between the cladding layers 320 and 360 and the corresponding waveguide layers 330 and 350, and/or the larger diffusion length of electrons and holes in these materials. The same is true for the other III-V compound lasers and II-VI semiconductor materials. In addition, by using a conductive substrate, such as, for example, the Si-doped GaAs substrate 310, the n-contact can be made through the backside surface of the substrate 310 instead of using a lateral n-contact ring electrode, as in the exemplary embodiment of the GaN cavity resonator grown on an insulating sapphire substrate shown in FIG. 11, which is discussed in greater detail below.

Since the p-layer conductivity in GaAs and other III-V and II-VI materials is much higher than that in GaN-based structures, it may be necessary to electrically isolate the center portion of disk from the p-contact ring electrodes and the p-layers in the laser structure. This can be achieved, for example, by proton implantation within the dashed region 390, with high energy (10 keV to several 100 keV) protons, and a post-implantation anneal to remove defects caused by the implantation process. Instead of proton implantation in the region 390, a center portion 395 of the structure 300 could be removed by dry and/or wet etching. The materials for the p- and n-contacts for the GaAs-based laser might also be different from the examples given for the GaN-based laser. Typical n-contacts for a GaAs-based laser include AuGe alloys, Ge/Au/Ni/Au or Sn/Au. Cr/Au, Zn/Au, Au/Zn/Au, Pt/Au, Ni/Au, or Ti/Pt/Au are used as p-contact materials.

As discussed above, FIG. 2 illustrates a first exemplary embodiment of a grating-outcoupled microcavity disk resonator 100 according to this invention, in which the cavity resonator 100 is formed in a circular disk shape. The circular grating-outcoupled cavity resonator shown in FIG. 2 can be realized using either the layer structure of FIG. 5 or of FIG. 6. In various exemplary embodiments, the outer circular shape shown in FIG. 2, and the grating region shown in FIGS. 3 and 4, can be created by etching the III-V nitride heterostructures 200 and 300 shown in FIGS. 6 and 7 using chemically-assisted ion beam etching (CAIBE). Chemically-assisted ion beam etching is a technique which can yield very smooth and vertical side walls. Smooth and vertical side walls are important in producing a device which has sufficient gain and clearly defined grating features. However, any other known or later developed technique, or combination of techniques, that provides sufficiently smooth and vertical side walls can be used.

The smoothness of the dry-etched side walls can be improved by a subsequently wet-chemical etching or photo-enhanced wet-chemical etching the dry-etched walls. It is also possible to coat the side walls with a thin insulating dielectric layer, such as, for example, a layer of $SiO_2$ or of $Si_3N_4$, to even out any protrusions in the surface. The side wall can also be oxidized to reduce the surface roughness. For example, AlGaAs layers can be laterally oxidized by a wet oxidation process, in which the etched areas are exposed to water vapor at temperatures in the range of about 300° C. to about 600° C.

The chemically-assisted ion beam etching process includes two components. First, argon ions are formed in an electron cyclotron resonance (ECR) plasma source. The argon ions are then accelerated using a potential drop of 200-800 volts between an acceleration grid and the sample stage. In various exemplary embodiments, the argon ions are accelerated at around 500 volts. The argon ion beam provides the physical etching component of the device processing. Chemical assistance comes from a shower head located above the substrate that injects the chemical etchant gases. The flow rates of gases, the energy of the ion beam, and the temperature of the substrate all affect the smoothness and verticality of the side walls. Increasing the chemical etch rate or increasing the temperature of the substrate may create more vertical side walls but with a rougher surface. In various exemplary embodiments, using the argon ion plasma alone will generate a 10-15° sloped side walls. However, using the chemical assistance increases the etch rate and gives more vertical side walls with the same surface roughness.

For exemplary embodiments described above with respect to FIG. 2, the samples were etched in a commercial chemically-assisted ion beam etching system from Technics Plasma (Kirchheim, Germany, model Ribetch 160 ECR LL). After patterning the InAlGaN heterostructure shown in FIG. 2 with photoresist, the samples were etched using chemically-assisted ion beam etching in a mixture of boron trichloride and chlorine. The argon flow rate was in the range between 2 sccm and 20 sccm to form an Ar ion plasma with a plasma voltage of 500 volts. In various exemplary embodiments, the Ar flow rate was about 5 sccm. The boron trichloride ($BCl_3$) flow rate was in the range between 0 sccm and 20 sccm. In various exemplary embodiments, the boron trichloride flow rate was 2 sccm. The chlorine ($Cl_2$) flow rate was in the range between 1 sccm and 20 sccm. In various exemplary embodiments, the chlorine flow rate was 8 sccm. The sample temperature during the etching process was in the range between 20 to 150° C. Atomic force microscopy performed on the resulting side wall surface indicated that a root-mean-square (nms) roughness of 40-80 Å was obtained for the surfaces formed by chemically-assisted ion beam etching under these conditions.

As discussed above, metal oxide chemical vapor deposition (MOCVD) is used to deposit the thin buffer layer 215, the current spreading layer 220, the strain compensation layer 225, the lower cladding layer 230, the lower waveguide layer 240, the active region 250, the current confinement layer 255 and finally the upper waveguide layer 260. Then, the MOCVD growth is interrupted after the upper waveguide layer 260 or 350 is grown, in order to fabricate the overgrown distributed feedback grating structures, as described below, with the grating in the upper waveguide layer as shown in FIGS. 3, 4, 6 or 7.

In an etched distributed feedback grating structure, the nitride laser heterostructure is first covered with a photoresist layer or a polymethylmethacrylate (PMMA) layer. The grating patterns are then defined in the photoresist layer or PMMA layer by photolithography (holographic exposure) or electron beam lithography. The grating is then transferred into the InAlGaN heterostructure by etching into the waveguide layer 260 or 350, such as, for example, by using a dry-etching method, such as CAIBE described above. After etching the grating into the waveguide layer, the photoresist layer or PMMA layer is removed and the wafer surface is cleaned for regrowth. The MOCVD growth resumes with the growth of the upper cladding layer 270 or 360 and the p-metal contact layer 280, 370 or 380.

Figure 8:
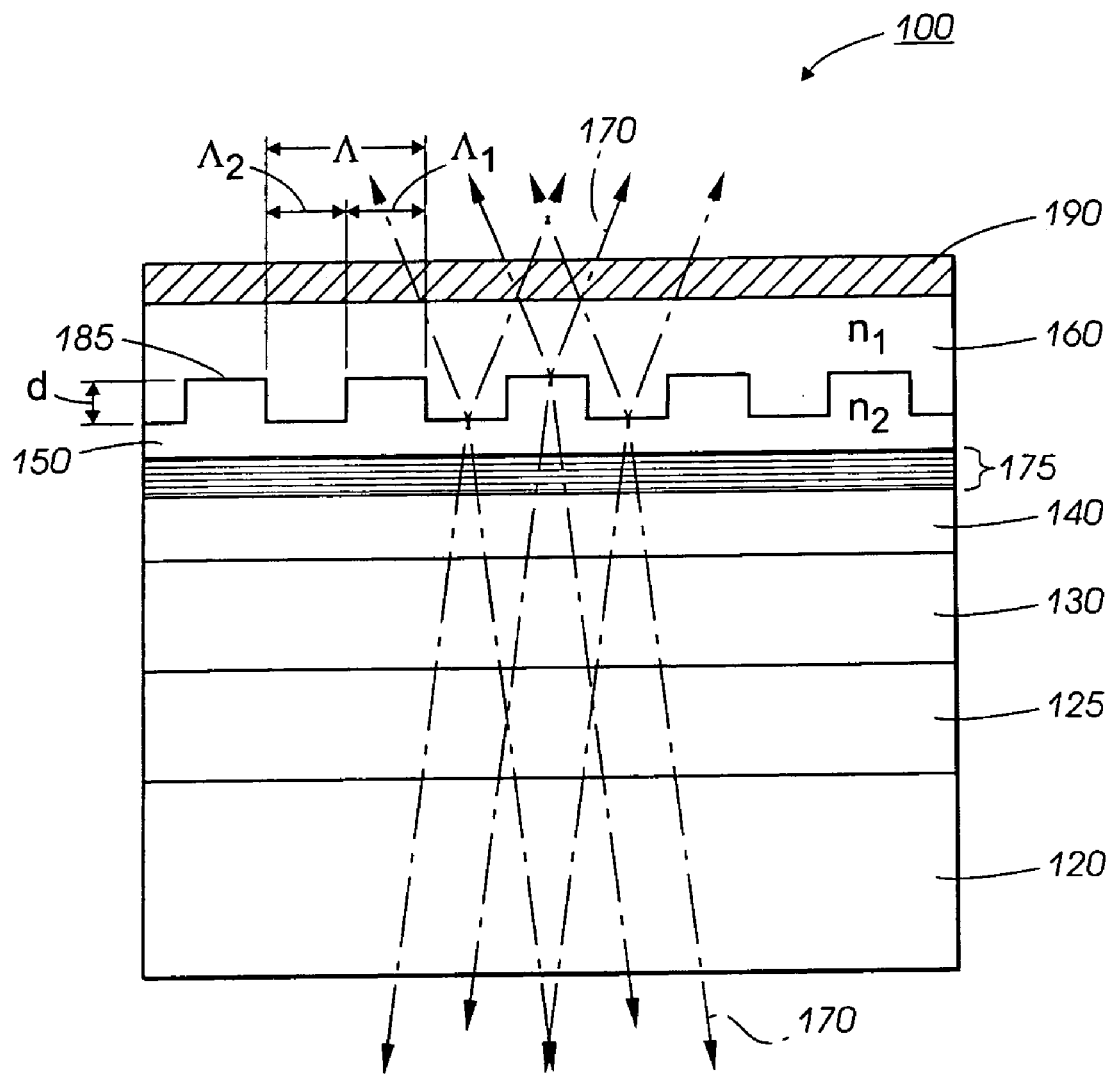
FIG. 8 is a side view of a second exemplary embodiment of a grating-outcoupled microcavity disk resonator according to this invention.

FIG. 8 shows a second exemplary embodiment of the grating-outcoupled microcavity disk resonator, which can be fabricated using the etch and overgrowth method described above. In this exemplary embodiment, the grating teeth 185 are rectangular rather than sawtooth, and can be fabricated by etching rectangular grooves into the waveguide layer and overgrowing the cladding layer. It should be appreciated that any of a number of different shapes for the grooves, beyond rectangular-shaped grooves and teeth, may be used to form the periodic pattern, such as any of those listed in FIG. 5.

Figure 9:
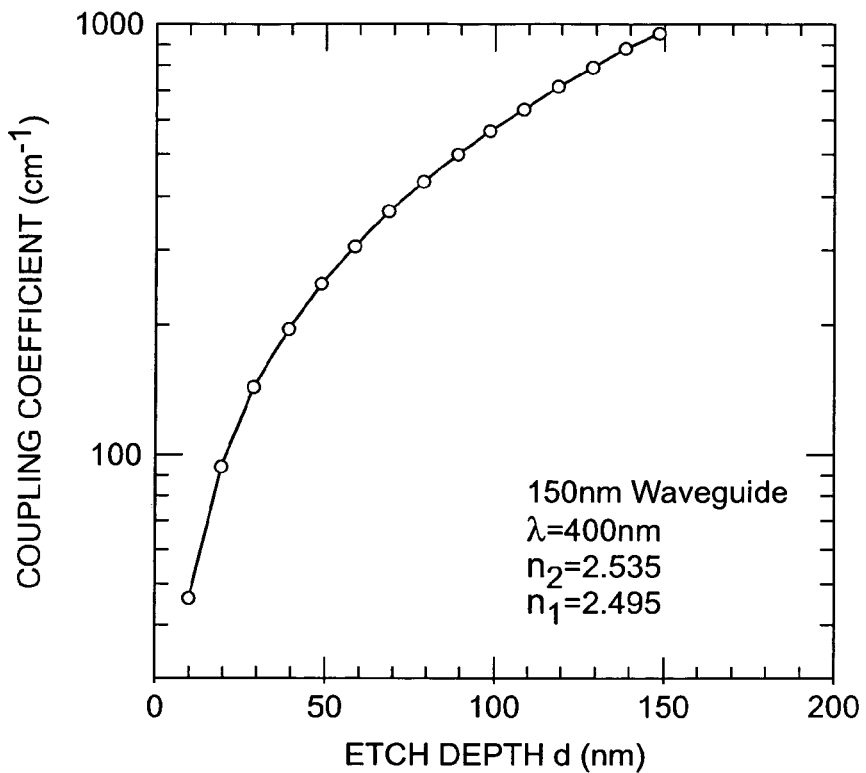
FIG. 9 is a plot of the coupling coefficient versus etch depth for the second exemplary embodiment of the grating-outcoupled microcavity disk resonator of FIG. 8.

Typically, the geometry of the grating teeth, whether rectangular, sawtooth, trapezoidal, etc., has relatively little influence over the performance of the grating in outcoupling light. However, the depth of the grating teeth typically has a large influence over the performance of the grating structure. This effect is shown in FIG. 9, which is a plot of the coupling coefficient K as a function of etch depth of the grating teeth for the rectangular geometry shown in FIG. 8. As shown in FIG. 9, the greater the coupling coefficient κ, the higher the reflectivity and outcoupling efficiency of the distributed feedback grating for a fixed grating length. FIG. 9 shows that, for a cladding material with an index of refraction of 2.495 over a waveguide material with index of refraction of 2.535, and a grating period of 150 nm, the coupling coefficient to a laser operating at 400 nm increases from about 100 $cm^{-1}$ to about 1000 $cm^{-1}$ when the etch depth increases from about 30 nm to about 150 nm.

It should be appreciated that the chemically-assisted ion beam etching (CAIBE) process can be used to form the sawtooth grating structure between the waveguide layer 150 and the cladding layer 160 of the device 100 shown in FIGS. 3 and 4, between the waveguide layer 260 and the cladding layer 270 of the device 200 shown in FIG. 6, and/or between the waveguide layer 350 and the cladding layer 360 of the device 300 shown in FIG. 7. It can also be used to form the rectangular grating structure in FIG. 8.

Figure 10:
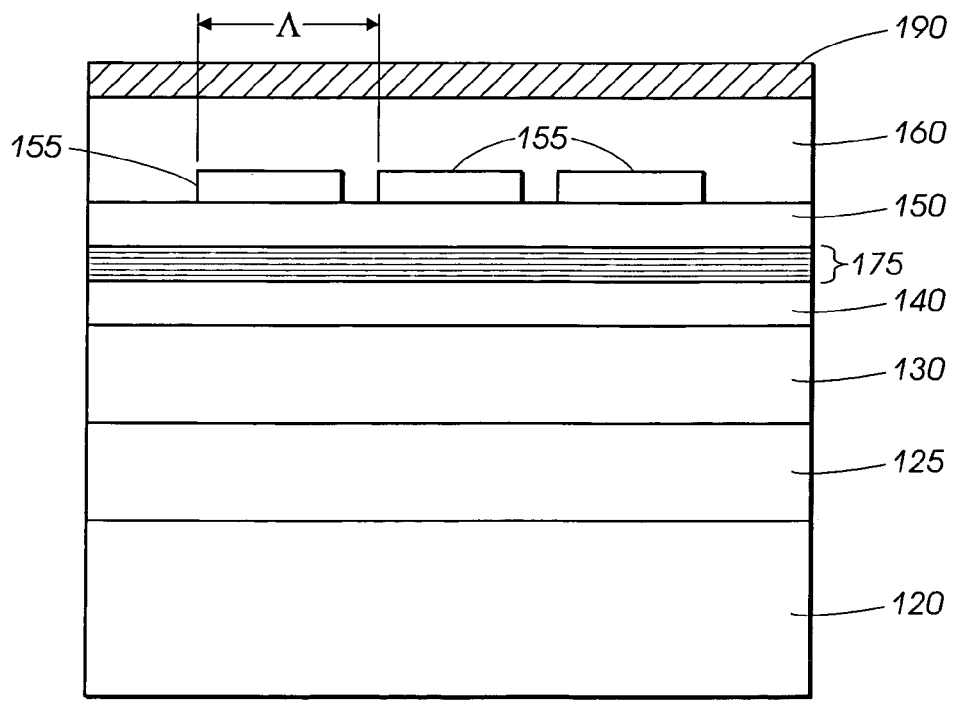
FIG. 10 is a side view of a third exemplary embodiment of a grating-outcoupled microcavity disk resonator according to this invention.

FIG. 10 shows a third exemplary embodiment of the grating outcoupled microcavity disk resonator according to this invention, which can also be fabricated using the regrowth process outlined above. As shown in FIG. 10, it is possible to deposit non-absorbing dielectric material, such as, for example, $SiO_2$, SiON, or $Si_3N_4$, on top of the waveguide to form a dielectric grating structure, and subsequently overgrow the resulting grating structure with the cladding layer material. In the third exemplary embodiment shown in FIG. 10, to form the dielectric grating, a layer of about 10 nm to about 200 nm of dielectric material 155 is deposited, for example, by using a plasma-enhanced chemical vapor deposition process, on the waveguide layer 150. To pattern the dielectric layer 155, the nitride laser heterostructure is covered with photoresist or PMMA and patterned using photolithography (holographic exposure) or electron beam lithography. The dielectric grating is then formed by etching grooves into the dielectric layer 155, e.g., using dry-etching, such as, for example, plasma etching in $CF_4$, or using wet etching. After etching the grooves into the dielectric layer 155, the photoresist or PMMA is removed and the exposed surface is cleaned for regrowth. The cladding layer 160, 270 or 360, and the p-contact layer 190, 280, 370 or 380, are then formed over the dielectric grating structure.

The overlap between the dielectric grating and the transverse optical mode will determine the coupling efficiency. Since the transverse mode has the highest intensity in the active region, the coupling coefficient is highest if the dielectric grating is close to the active region. By moving the dielectric grating further away from the active region, for example, by moving it into the cladding layer, the coupling coefficient decreases.

It should be appreciated that chemically-assisted ion beam etching (CAIBE) is only one of several dry-etching methods that can be used to form the various exemplary structures shown in FIGS. 3-8 and 10. Other methods include, for example, reactive ion etching (RIE), inductive-coupled plasma etching (ICP), and photo-enhanced wet chemical etching. When other material systems are used, such as, for example, GaAs or InP, the dry etching processes will be different and specific to the respective chemistry involved. Furthermore, wet etching processes or a combination of dry etching and wet etching can also be used.

The lasing modes of the grating-outcoupled microcavity disk resonators 100-300 are whispering gallery modes that occur near the periphery of the grating-outcoupled cavity resonators 100-300. The lasing modes circulate around the disk center by total internal reflection at the side walls. Reflection of the light occurs at the interface between the structure and air, because of the discontinuity in the relative indices of refraction between the layer structure and air. The critical angle, above which the light is totally internally reflected, for GaN and air is about 24°, and for GaAs and air is about 17°.

A discontinuity in the refractive index also occurs at the boundaries of the grating features, i.e. the sawteeth, causing the diffraction of the circulating light. However, in the case of the grating region 185, the variation in the refractive index is only that of the waveguide layers 150, 260 and 350, compared to the cladding layers 160, 270 and 360, respectively. For a typical laser operating at about 400 nm, the Al mole fraction in the AlGaN cladding layer is about 8%, corresponding to an index of refraction of 2.495. The refractive index of the GaN waveguide layer at that wavelength is 2.535. Therefore, the variations in the refractive indices at each interface between these two layers is on the order of about 0.040.

The circulating whispering gallery modes interact with the periodic variation in the index of refraction in the grating region 185 of the resonators 100-300, as shown in FIGS. 3-8 and 10. For second-order gratings, the laser emission emerges from the grating region 185 in a direction 170 that is substantially orthogonal to the plane of the cavity resonators 100-300. In particular, the grating aperture 185 outcouples some of the circulating modes into propagating (rather than evanescent) light waves. Therefore, the output of the grating-outcoupled cavity resonator can be collected several millimeters away from the grating region 185, rather than the sub-micron distance away that would be the case with evanescent wave coupling. The outcoupling mechanism is therefore fundamentally different from the asymmetric resonant cavity resonators shown in FIG. 1, where the outcoupling was achieved only by near-field evanescent coupling between the laser resonator 1 and a nearby optical fiber 14 or 16.

In the case of nitride resonators 100-300 illustrated in FIGS. 3-8 and 10, the grating region 185 is implemented in the upper cladding layers 160, 270 360 and upper waveguide layers 150, 260 and 350. However, the grating region 185 can also be formed on the lower cladding layer 130, 230 or 320. However, this presents more design complications in planarizing the surface of the grating region 185 before depositing the quantum wells of the active region 175.

As shown in FIGS. 3 and 4, in the resonator 100, the electrode contact 190 is continuous over both the grating region 185 as well as the rest of the cavity resonator 100. FIG. 11 is a simplified schematic top view of one exemplary embodiment of an electrically pumped grating-outcoupled cavity resonator 400, corresponding to the device shown in FIG. 3. For the sake of clarity, the grating region is not shown in FIG. 11. FIG. 12 shows a cross section of the layer structure of the grating-outcoupled cavity resonator 400. As shown in FIGS. 11 and 12, the p-electrode 420 sits on the top surface of the grating-outcoupled cavity resonator structure 430, and the n-electrode 440 sits on a pedestal formed on the n-type (Al)(In)GaN current spreading layer 450, which covers the substrate 460. In various exemplary embodiments, the p-electrode 420 comprises a layer 420 of palladium formed over and around an insulating disk 410 of $SiO_2$ to form a concentric contact ring 425. The concentric contact ring 425 overlaps the high gain region near the perimeter of the grating-outcoupled cavity resonator 400. The silicon dioxide insulating layer 410 insulates the center of the p-electrode 420 from the underlying semiconductor p-doped gallium nitride layer 430.

In various exemplary embodiments, the electrode structures shown in FIGS. 11 and 12 are formed after fabricating the heterostructures. After growing the heterostructures using, for example, metal-organic chemical vapor deposition (MOCVD), magnesium doping is activated by rapid thermal annealing. Next, an ohmic p-metal contact film layer 420 is formed on or over the nitride layer 430 and the insulating layer 410 to form the contact ring p-electrode 425. In various exemplary embodiments, the contact film layer can be formed using nickel (Ni), palladium (Pd), platinum (Pt), a nickel-gold alloy Ni/Au, a palladium/titanium/gold alloy Pd/Ti/Au, or a platinum/titanium/gold alloy Pt/Ti/Au by thermal or e-beam evaporation. Alternatively, a transparent conductive oxide layer, such as, for example, indium tin oxide (ITO) or zinc oxide (ZnO), may be used as the contact film layer 420. ITO and ZnO can be deposited by sputter deposition. The transparent conductive oxide can be overcoated with a metal contact and an aperture can be opened in the ITO. The p-metal contacts may then be annealed.

The outer shape of the grating-outcoupled microcavity disk resonator 400 shown in FIGS. 11 and 12 is then formed by chemically-assisted ion beam etching to form the structure 430. A hole may be formed at the same time, by removing the central part of the laser resonator structure 400. This reduces, and ideally prevents, exciting of modes with non-circular trajectories, and prevents such modes from going through the center of the disk. The n-metal ring contact 440 is then deposited by thermal or e-beam evaporation and annealed. The n-metal contact 440 may be an alloy of titanium/aluminum (Ti/Al), titanium/gold (Ti/Au), or titanium/aluminum/platinum/gold (Ti/Al/Pt/Au).

A dielectric isolation layer 410 formed from, for example, $SiO_2$, $Si_3N_4$, SiON, polyimide and the like, can be deposited, for example, by physical evaporation chemical vapor deposition (PECVD) e-beam or sputter processing (except for polyimide). An opening in the dielectric layer 410 for p-metal and n-metal pads may be made by plasma etching, for example, by using $CF_4$. The dielectric isolation layer 410 can remain on the side walls of the grating-outcoupled cavity resonator 400 in order to reduce the refractive index step between the nitride heterostructures and air and also to further smoothen the side wall surface.

The n-metal pads 440 and p-metal pads 420 are then deposited by thermal or e-beam evaporation. The pads may be alloys of titanium/gold (Ti/Au) or titanium/platinum/gold (Ti/Pt/Au), for example. The side walls may be coated with a metal such as, for example, Al or a dielectric material, such as, for example, $SiO_2/Ta_2O_5$, which may be formed, for example, by thermal or e-beam evaporation. In the case of a metal coating, the side walls should also be covered with a dielectric insulation layer.

Figure 13:
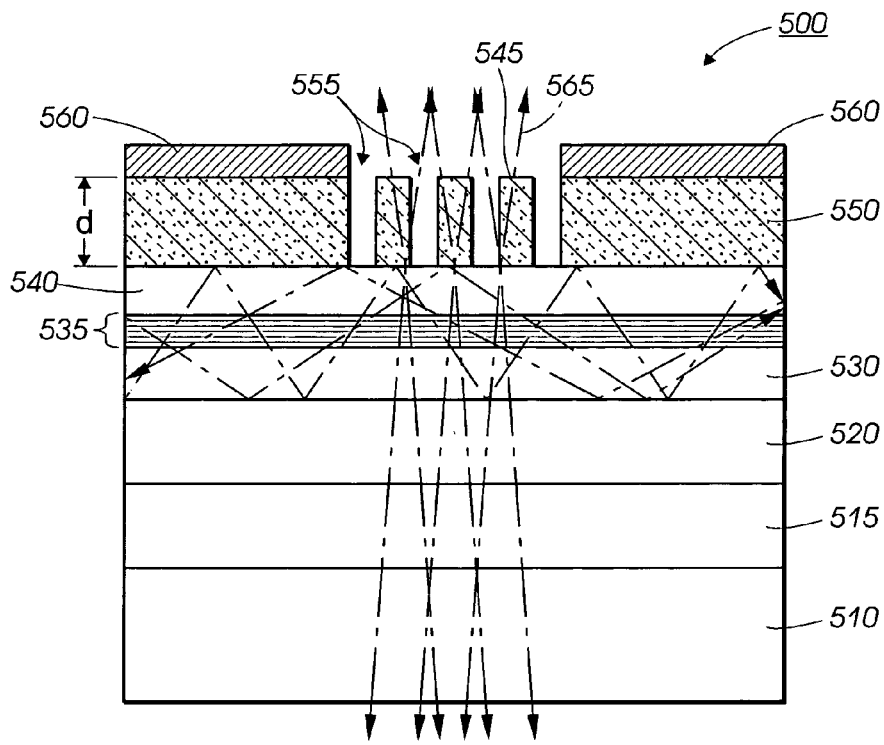
FIG. 13 is a side view of a fourth exemplary embodiment of a grating-outcoupled microcavity disk resonator according to this invention.

FIG. 13 shows a fourth exemplary embodiment of a grating-outcoupled cavity resonator 500 according to this invention, where the grating region 185 is formed by etching grooves into the cladding layer, leaving a set of parallel pillars between the grooves. As before, the rectangular-shaped grooves shown in FIG. 13 are only exemplary. The shapes of the grooves may also be sinusoidal, sawtooth or trapezoidal, and may depend on the process used to form them.

As in the first exemplary embodiment 100 shown in FIGS. 3 and 4, a buffer layer 515 is deposited on or over a substrate 510, and a lower cladding layer 520 is formed on or over the buffer layer 515. A lower waveguide layer 530 is formed on or over the lower cladding layer 520. The active region 535 of the device is deposited on or over the lower waveguide layer 530. An upper waveguide layer 540 is deposited on or over the active region 535. An upper cladding layer 550 is formed on or over the upper waveguide layer 540. The grating region 185 is formed by etching a set of voids 555 into the upper cladding layer 550, leaving a set of parallel pillars 545 in the cladding layer 550. A metal contact layer 560 is formed on or over the portion of the cladding layer 550 that is not interrupted by the grating region 185.

In contrast to the situation described in FIG. 9, for the fourth exemplary embodiment shown in FIG. 13, the material occupying the etched area 555 is typically air. Therefore, the refractive index contrast between the material forming the pillars 545 and the material occupying the etched voids 555 is very large. This results in a strong coupling between the circulating modes in the cavity resonator and the grating formed by the grating pillars 545 and the etched areas 555. The refractive index contrast can be tailored by refilling the etched areas 555 with an insulating dielectric material such as, for example, $SiO_2$ (n=1.5), $Si_3N_4$ (n=2.1) or AlGaN (n=2.455 for an Al mole fraction of 16%) and/or by adjusting the etch depth of the grating pillars 545. In other exemplary embodiments, the trench structures can be filled with a reflective material so that any diffracted light 565 propagates only in a downward direction and does not propagate in the upward direction.

Figure 14:
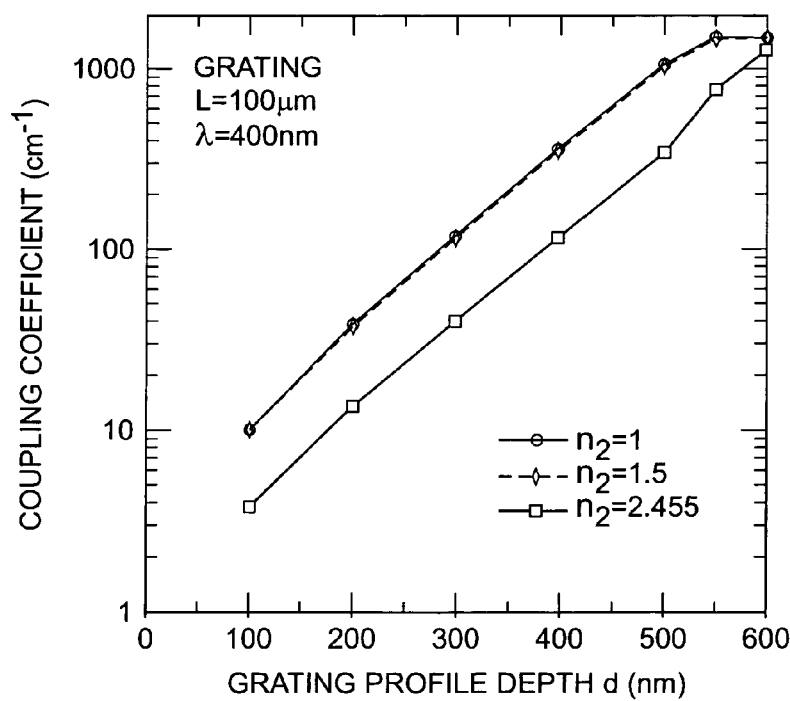
FIG. 14 is a plot of the coupling coefficient versus the grating profile depth for the fourth exemplary embodiment of the grating-outcoupled microcavity disk resonator shown in FIG. 13.

FIG. 14 is a graph showing the effect of the relative indices of refraction on the coupling coefficient, as well as the effect of the grating etch depth on the coupling coefficient. The behavior demonstrated in FIG. 14 is similar to that shown in FIG. 9 for the embodiment including the rectangular grating teeth, where the coupling coefficient increases with increasing etch depth of the teeth, and increases with increasing contrast between the indices of refraction of the cladding layer compared to the etched area. For example, when the etched areas holds only air (n=1.0), the coupling coefficient is approximately twice as large as when the etched areas hold a material with an index of refraction of n=2.455.

Figure 15:
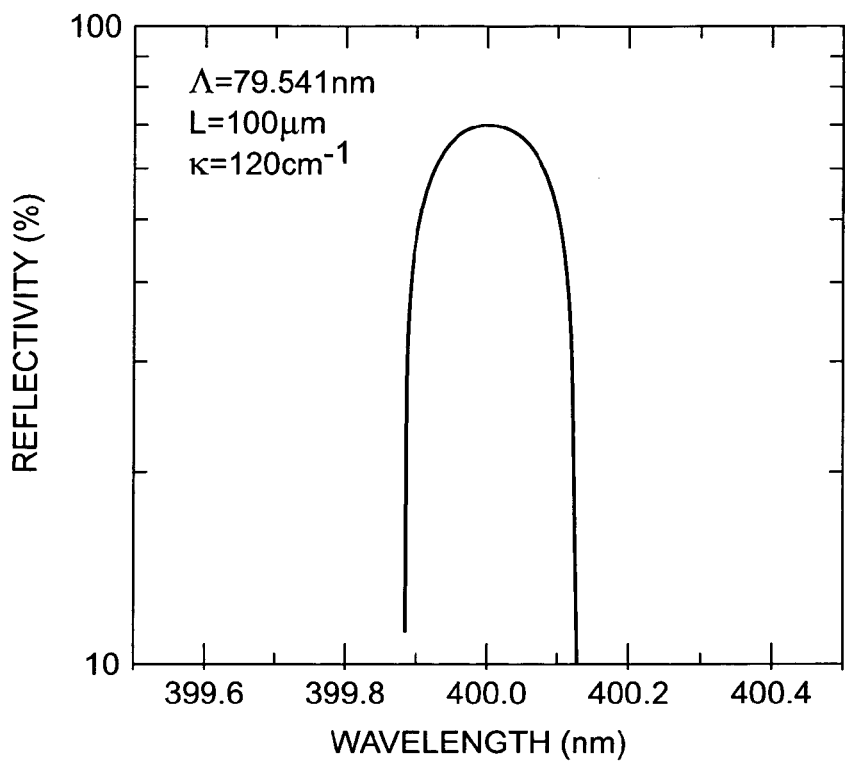
FIG. 15 is a reflection spectrum for the grating-outcoupled microcavity disk resonator of FIG. 13.
Figure 16:
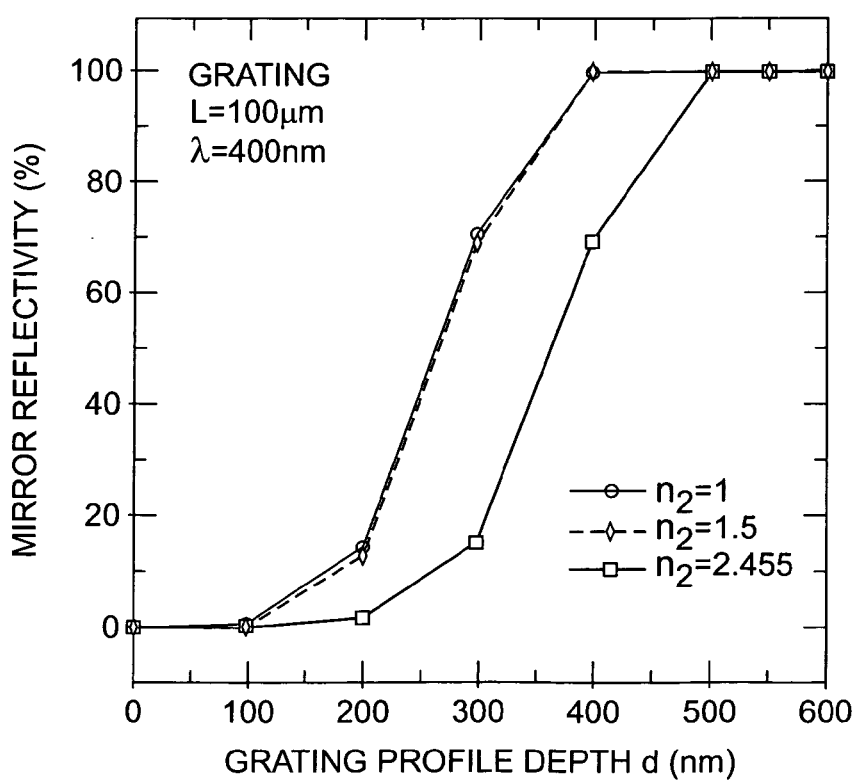
FIG. 16 is a plot of mirror reflectivity versus grating profile depth for the grating-outcoupled microcavity disk resonator of FIG. 13.

FIG. 15 shows the theoretical reflection spectrum of an etched grating for a coupling coefficient of 120 $cm^{-1}$ and a grating length of 100 μm. The grating periodicity for this analysis was 79.541 nm. FIG. 16 shows the theoretical reflectivity depending on the grating etch depth d and for different refractive indices for a rectangular-shaped etched grating, with an emission wavelength of 400 nm.

Figure 17:
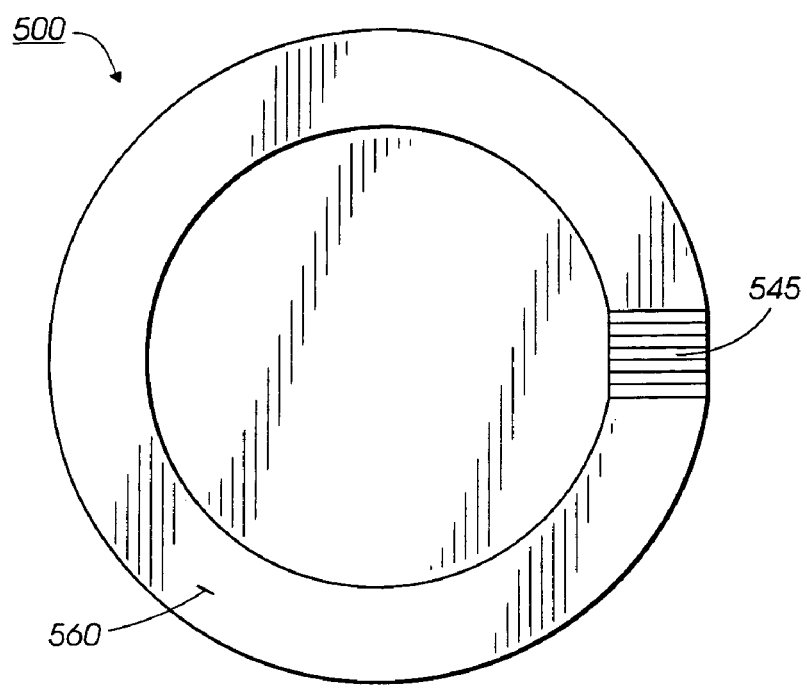
FIG. 17 is a top view of the fourth exemplary embodiment of the grating-outcoupled microcavity disk resonator of FIG. 13, showing the geometry of the top electrode according to this invention.

FIG. 17 shows a top view of the fourth exemplary embodiment of FIG. 13. As shown in FIG. 17, in the grating-outcoupled cavity resonator 500, the contact layer 560 does not extend over or cover the grating region 545. Therefore, the electrode contact layer 560 is discontinuous over the grating region 545, as shown in FIG. 13, and the grating region 545 is not pumped. One advantage of the grating-outcoupled cavity resonator 500 over the resonator 100 shown in FIGS. 3-8 and 10 is that the diffraction grating formed by the grating pillars 545 and the etched areas 555 can be implemented after the entire laser structure, including the top electrode 560, has been fabricated, because the grating-outcoupled cavity resonator 500 does not require any regrowth steps. The grating region 185 is formed by etching the etched areas 555 through all the overlying layers of the structure, including the top electrode 560, to leave the pillars 545. The grating-outcoupled cavity resonator 500 is therefore much simpler to manufacture compared to the grating-outcoupled cavity resonator 100 shown in FIGS. 3 and 4.

Figure 18:
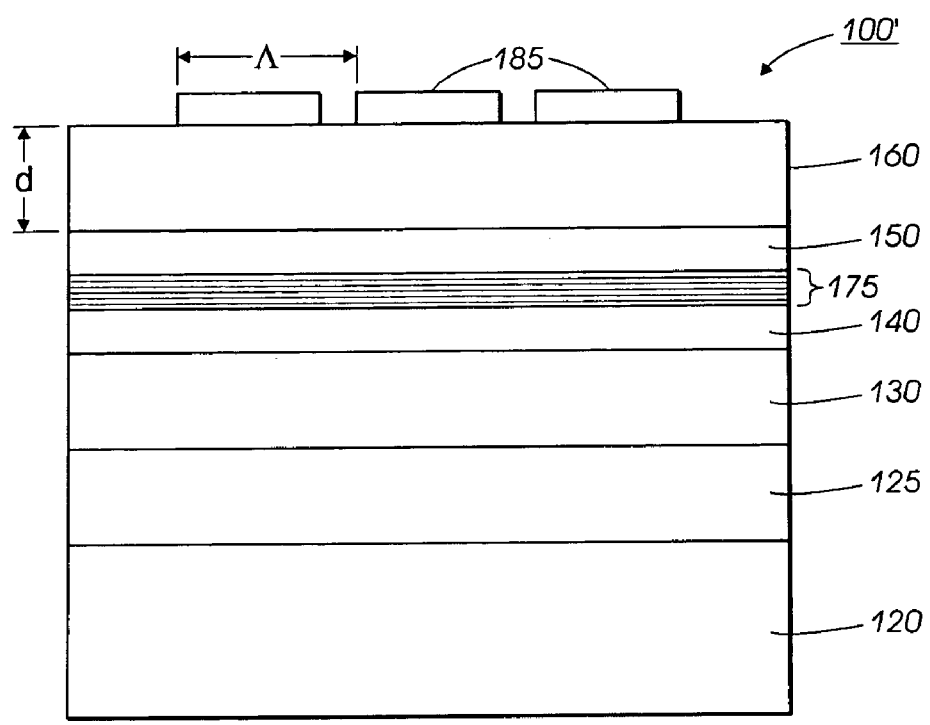
FIG. 18 is a side view of a fifth exemplary embodiment of a grating-outcoupled microcavity disk resonator according to this invention.
Figure 19:
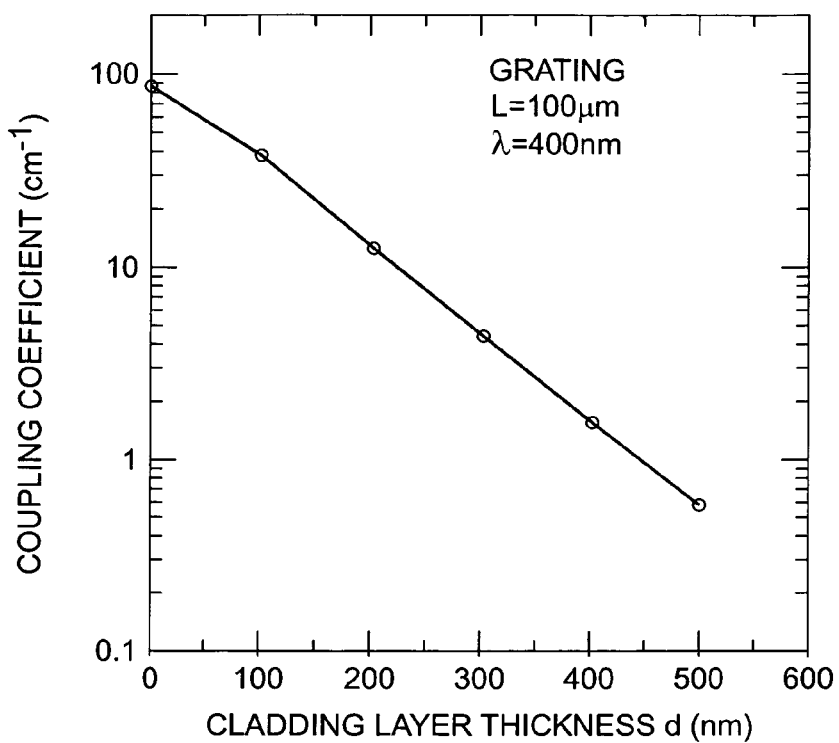
FIG. 19 is a plot of the coupling coefficient versus cladding layer thickness for the grating-outcoupled microcavity disk resonator of FIG. 18.
Figure 20:
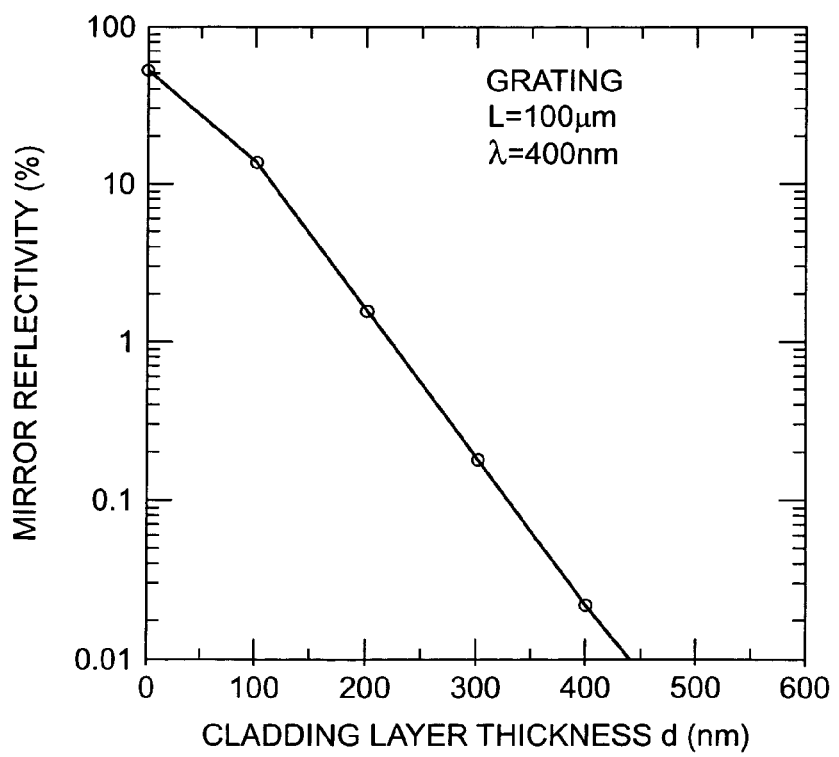
FIG. 20 is a plot of mirror reflectivity versus cladding layer thickness for the grating-outcoupled microcavity disk resonator of FIG. 18.

FIG. 18 shows a fifth exemplary embodiment that does not require regrowth of the cladding layer. In this exemplary embodiment, the grating can be formed by depositing a metal layer 185 or a combination of metal layers, formed, for example, using Ti/Au, Pd/Au, Ni/Au, Pd/Ti/Au, or the like, on (or over) top of the upper cladding layer 160. Instead of a metal layer, the layer could be a conductive oxide such as indium tin oxide (ITO). Therefore, the conductive material may be at least one of at least one metal layer and a conductive oxide. The grating is formed by depositing the metal into a striped pattern, where the striped pattern can be used as the contact electrode as well as the distributed feedback grating to outcouple light. FIG. 19 shows the theoretical relationship between the coupling coefficient κ and the cladding layer thickness d, shown in FIG. 18, for this fifth exemplary embodiment. FIG. 20 shows the theoretical relationship between the mirror reflectivity and the cladding layer thickness for this fifth exemplary embodiment. As shown in FIGS. 19 and 20, the mirror reflectivity and coupling coefficient increase as the thickness of the cladding layer decreases, because the grating region is closer to the active region as the cladding layer thickness decreases. The thinner the cladding layer, the higher the optical field strength at the grating, and thus the higher the coupling coefficient and mirror reflectivity.

Figure 21:
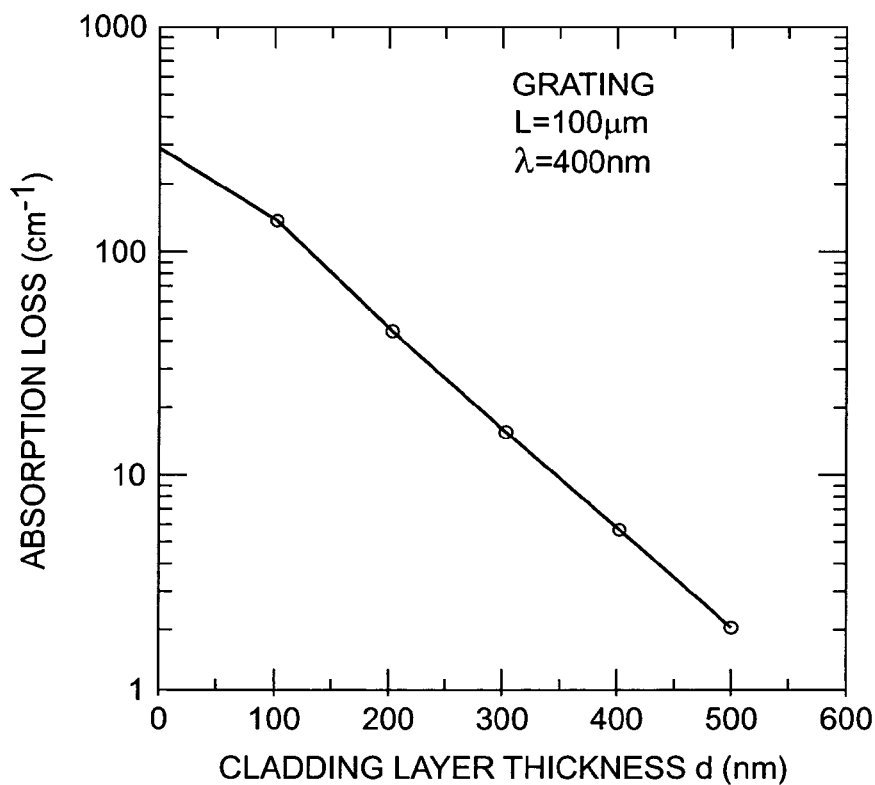
FIG. 21 is a plot of absorption loss versus cladding layer thickness for the grating-outcoupled microcavity disk resonator of FIG. 18.

However, since metals tend to be absorbing, the metal layer should not be placed too close to the active layer, because the metal layer decreases the gain by contributing to the absorption loss of the grating-outcoupled microcavity disk resonator. This trend is shown in FIG. 21, which shows the absorption loss rising to over 100 cm$^{-1}$ when the cladding layer thickness decreases to less than 100 nm. Absorption losses of less than about 10 cm$^{-1}$ are acceptable, which means that the maximum usable coupling coefficient is in the range of a few cm$^{-1}$. In order to compensate for the smaller coupling coefficient, the length of the grating can be increased and the grating can even be made to extend over the entire circumference of the circular disk resonator. For example, for a microcavity disk resonator with a diameter of 100 µm and a coupling coefficient of 4 cm$^{-1}$, about 1% of the light would be outcoupled per roundtrip around the perimeter of the disk resonator.

Figure 22:
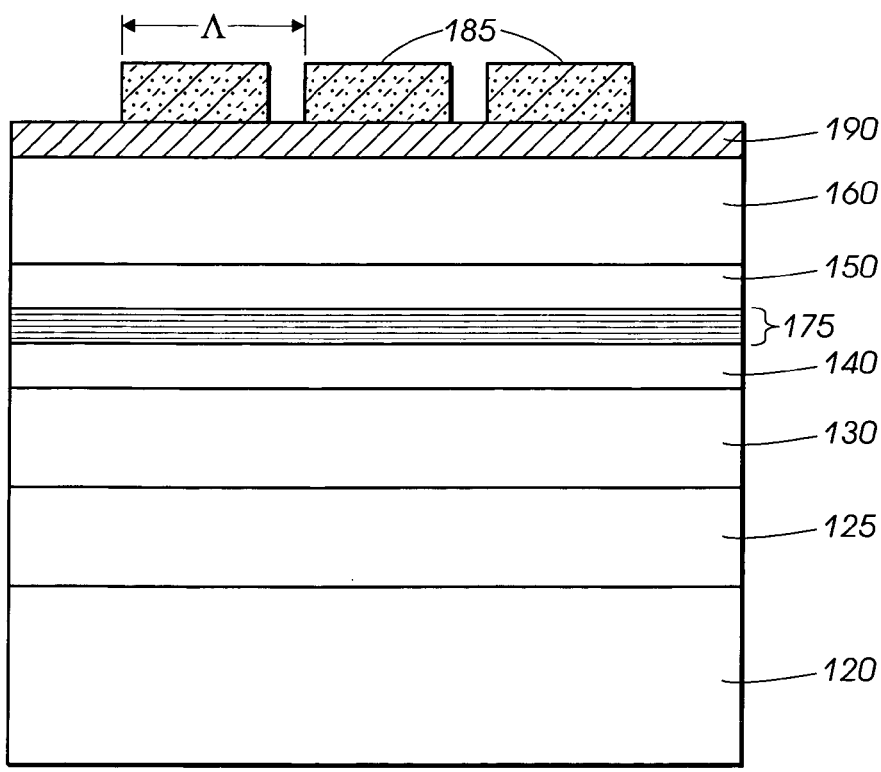
FIG. 22 is a sixth exemplary embodiment of a grating-outcoupled microcavity disk resonator according to this invention.
Figure 23:
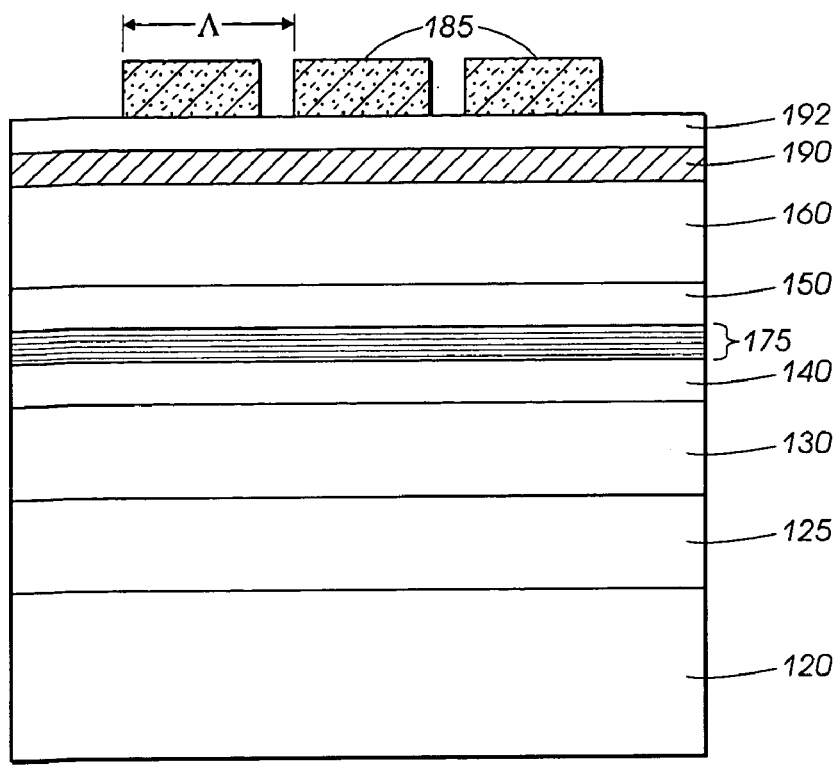
FIG. 23 is an seventh embodiment of a grating-outcoupled microcavity disk resonator according to this invention.

As shown in FIG. 22, transparent conductive electrodes could be used instead of an absorbing metal grating. In this sixth exemplary embodiment, the transparent electrodes could be deposited on or over the top surface of the contact layer 190. For example, indium tin oxide (ITO) has a very high electrical conductivity. Additionally, the absorption of ITO is fairly low for wavelengths greater than 450 nm. This would reduce the limitation on the coupling coefficient due to absorption in the surface grating layers. As shown in FIG. 22, the metal or ITO stripes are placed on or over a thin layer of GaN contact material 190, to form a grating region 185. FIG. 23 shows a seventh exemplary embodiment of the surface grating approach. In FIG. 23, the metal stripes are placed on or over a thin layer of ITO 192, which is deposited on or over the GaN contact material 190.

Figure 24:
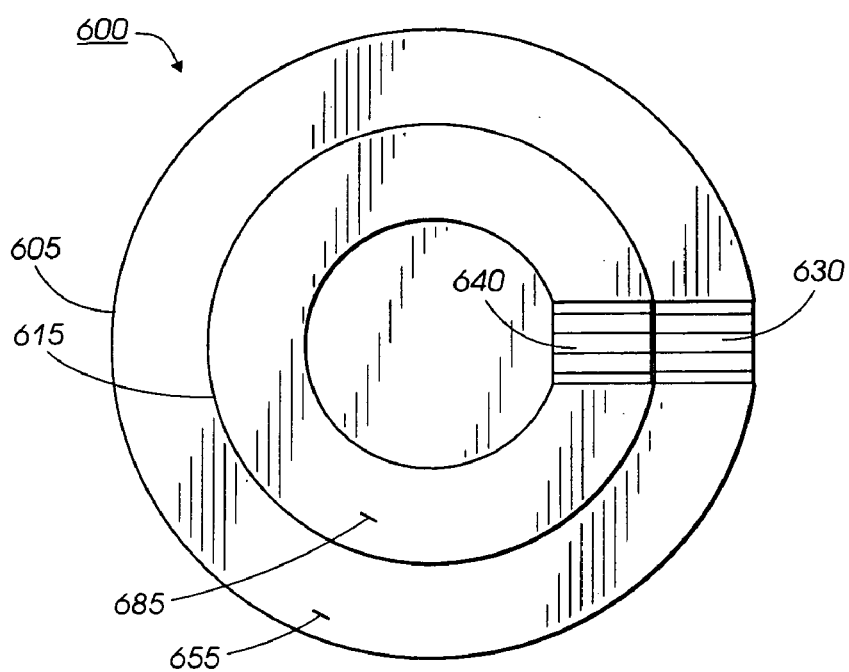
FIG. 24 is a top view of an eighth exemplary embodiment of a grating-outcoupled cavity resonator according to this invention.

FIG. 24 shows an eighth exemplary embodiment of a grating-outcoupled cavity resonator 600 according to this invention. As shown in FIG. 24, the grating-outcoupled cavity resonator 600 includes two grating-outcoupled cavity resonators 605 and 615, where the second grating-outcoupled cavity resonator 615 is formed on top of the first grating-outcoupled cavity resonator 605. As shown in FIG. 24, each grating-outcoupled cavity resonator 605 and 615 has a separate grating 630 or 640, respectively, that is tuned to match the resonant frequency of that cavity resonator 605 or 615. That is, the grating period of each grating 630 and 640 is designed to match the wavelength of the respective active region of the grating-outcoupled cavity resonator 605 or 615. Each grating-outcoupled cavity resonator 605 and 615 may be designed to lase at the same resonant frequency, or may lase at a different resonant frequency. The gratings 630 and 640 can therefore be designed to produce two output beams of the same frequency or of different frequencies, but, in either case, spaced very close together. The grating-outcoupled cavity resonators 605 and 615 may be concentric, with different diameters.

Figure 25:
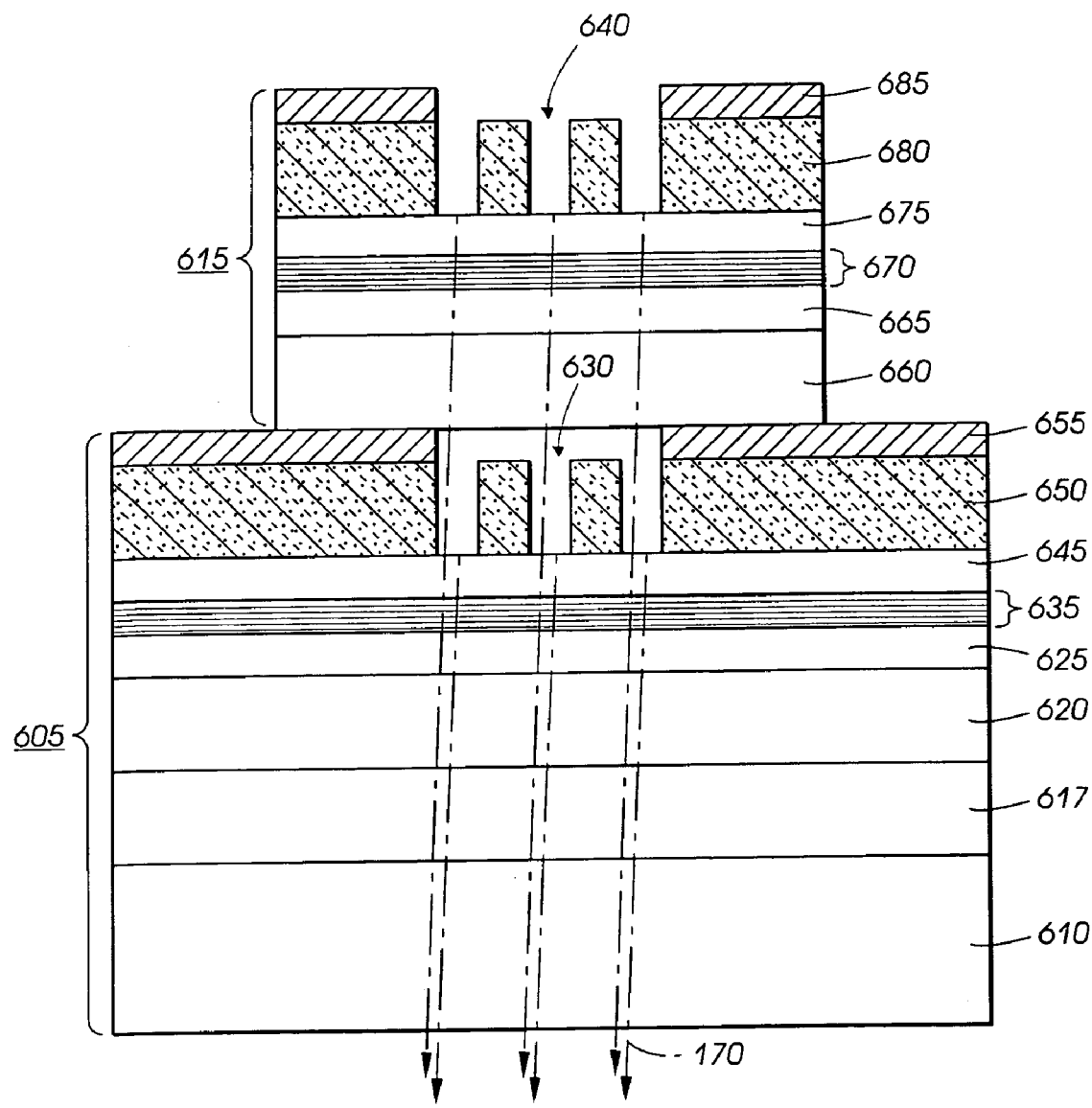
FIG. 25 is a side view of the eighth exemplary embodiment of the grating-outcoupled cavity resonator.

FIG. 25 shows a side view of the grating-outcoupled cavity resonator 600. The lower, outer grating-outcoupled cavity resonator 605 is fabricated on or over a buffer layer 617 formed on or over a substrate 610. A lower cladding layer 620 is formed on or over the buffer layer 617. The lower waveguide layer 625 is formed on or over the lower cladding layer 620. The active region 635 is formed on or over the lower waveguide layer 625. The upper waveguide layer 645 is deposited on or over the active region 635. The upper cladding layer 650 is formed on or over the upper waveguide layer 645. A metal contact layer 655 is deposited on or over the upper cladding layer 650. The grating region 630 for the lower, outer grating-outcoupled cavity resonator is formed in the upper cladding layer 650, by etching a set of voids into the upper cladding layer 650, using a method similar to that described above with respect to the grating-outcoupled cavity resonator 500.

The upper, inner grating-outcoupled cavity resonator 615 is fabricated on top of the lower, outer grating-outcoupled cavity resonator 605. A lower cladding layer 660 of the upper, inner grating-outcoupled cavity resonator 615 is deposited on or over the metal contact layer 655 of the lower, outer grating-outcoupled cavity resonator 605. A lower waveguide layer 665 formed on or over the lower cladding layer 660. An active region 670 is formed on or over the lower waveguide layer 665. An upper waveguide layer 675 is formed on or over the active region 670. An upper cladding layer 680 is formed on or over the upper waveguide layer 675. A metal contact layer 685 is formed on or over the upper cladding layer 680. The grating region 640 for the upper, inner grating-outcoupled cavity resonator is formed in the upper cladding layer 680, by etching a set of voids into the upper cladding layer 680, using a method similar to that described above with respect to the grating-outcoupled cavity resonator 500.

The two gratings 630 and 640 are shown in FIG. 24 as sets of parallel pillars formed in the cladding layers 650 and 680 of the resonators 605 and 615, respectively. The electrode contact layers 655 and 685 are discontinuous over the grating regions 630 and 640 formed in the cladding layers 650 and 680. The grating-outcoupled microcavity disk resonator 600 is therefore capable of outputting two separate laser beams at the two outcoupling gratings 630 and 640. Of course, any number of grating-outcoupled microcavity disk resonators beyond the two shown can be incorporated into the grating-outcoupled microcavity disk resonator 600.

Advantages of the grating-outcoupled microcavity disk resonators 100-600 include that the output beam has a very small divergence angle, and that, for second-order gratings, the outcoupled light 170 is emitted normal to the surface of the disk. In such a configuration, the grating-outcoupled microcavity disk resonators 100-600 combine the benefits of in-plane lasers, such as high power and/or good heat-sinking, with the benefits of a vertical cavity surface emitting laser VCSEL, such as a narrow beam profile, on-chip testing, and/or easy integration into arrays.

Figure 26:
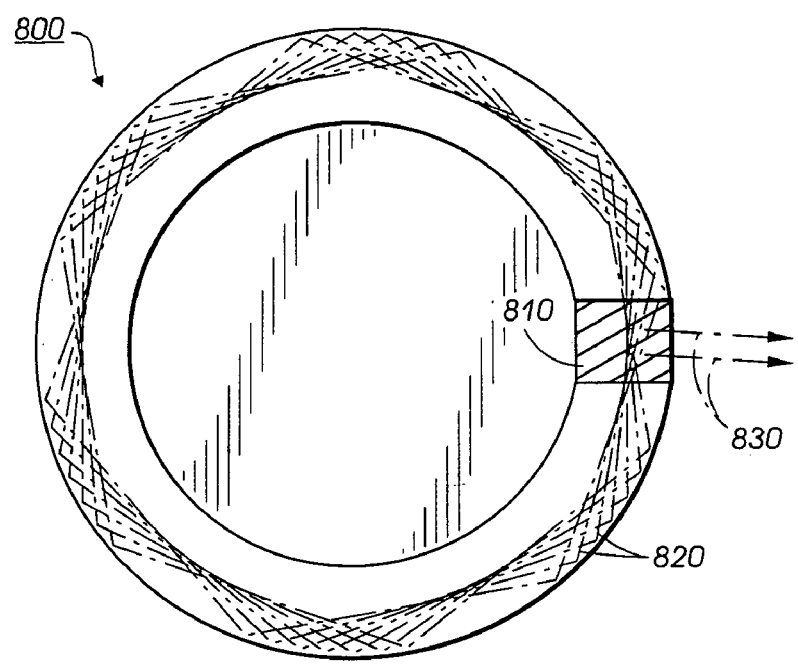
FIG. 26 is a top view of a ninth exemplary embodiment of a grating-outcoupled cavity resonator according to this invention.

FIG. 26 shows a ninth exemplary embodiment of a grating-outcoupled cavity resonator 800 according to this invention. As shown in FIG. 26, the grating-outcoupled cavity resonator 800 has a first-order output grating 810 that is disposed at an angle to the circulating modes 820. The first-order angled grating 810 can outcouple the laser emission 830 radially (or at some other angle) from the grating-outcoupled cavity resonator, rather than orthogonally from the plane of the resonator 800. In this case, the grating pattern of the grating 810 can be non-linear, so that the laser emission 830 can be focused and/or collimated. Blazing the grating 810 would allow preferential outcoupling of the clockwise or counterclockwise modes, if desired.

Figure 27:
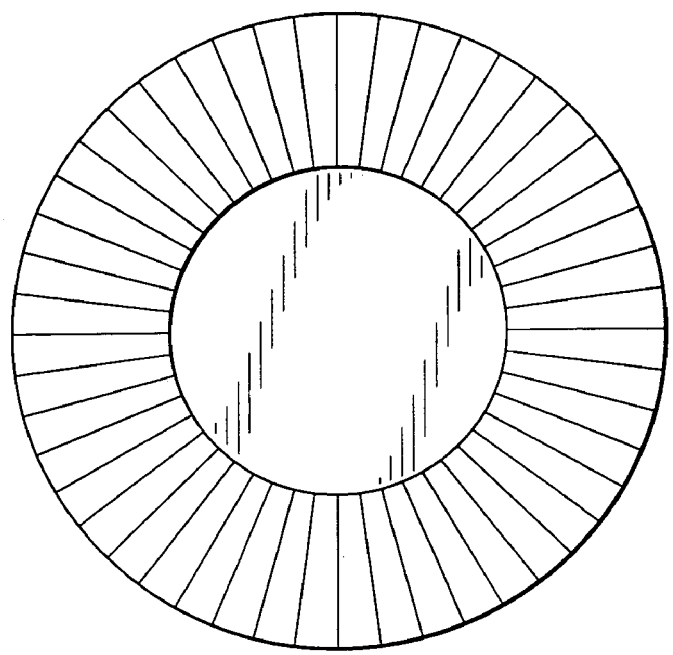
FIG. 27 is a top view of a tenth exemplary embodiment of a grating-outcoupled microcavity disk resonator according to this invention.
Figure 28:
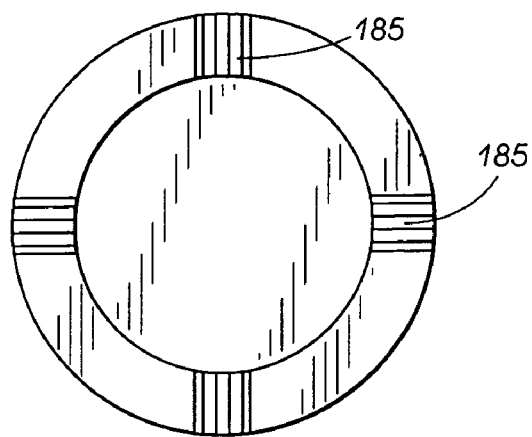
FIG. 28 is a top view of an eleventh exemplary embodiment of a grating-outcoupled microcavity disk resonator according to this invention.
Figure 29:
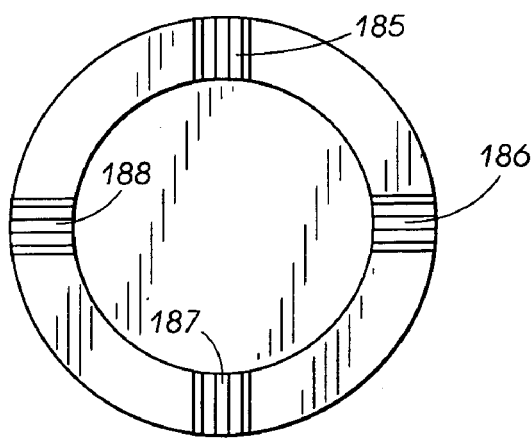
FIG. 29 is a top view of a twelfth exemplary embodiment of a grating-outcoupled microcavity disk resonator according to this invention.
Figure 30:
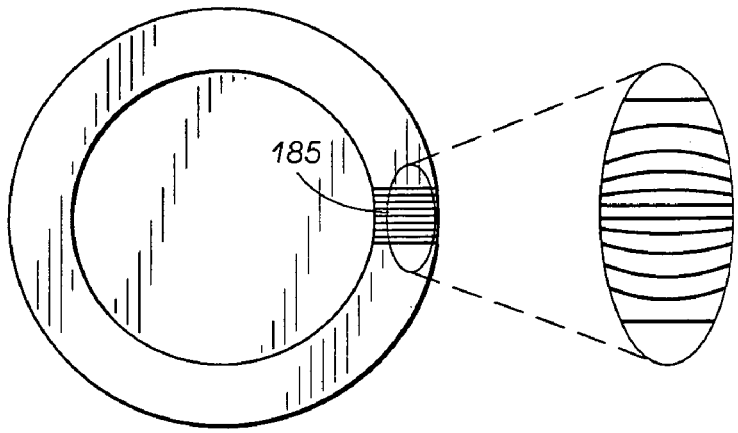
FIG. 30 is a top view of a thirteenth exemplary embodiment of a grating-outcoupled microcavity disk resonator according to this invention.

The outcoupling efficiency for a fixed coupling coefficient can also be increased by increasing the grating length. For example, in a tenth exemplary embodiment of a grating-outcoupled cavity resonator according to this invention, shown in FIG. 27, the grating can be extended over the entire circumference of the microcavity disk resonator. Alternatively, in an eleventh exemplary embodiment of a grating-outcoupled cavity resonator according to this invention, shown in FIG. 28, several areas can be covered with a grating 185. In a twelfth exemplary embodiment of a grating-outcoupled cavity resonator according to this invention, shown in FIG. 29, each grating region 185-188 may have a slightly different periodicity, to outcouple light of slightly different wavelengths at each different position. Finally, in a thirteenth exemplary embodiment of a grating-outcoupled cavity resonator according to this invention shown in FIG. 30, the shape of the distributed feedback gratings 185 can also be modified to change the shape of the output beam.

The grating regions 185, 630, 640 or 810 are designed to be non-intrusive and relatively weak perturbations on the symmetric system, so that scattering is minimal and pumping and modal purity are enhanced. It should be appreciated that the grating-outcoupled cavity resonators 100-800 can use other closed shapes in which the whispering gallery modes can be sustained with low loss, such as the asymmetric resonant cavity shown in FIG. 1. The symmetry of the structure is only weakly perturbed by the presence of the grating region along the outer radius of an otherwise smooth circumference.

While this invention has been described in conjunction with the exemplary embodiments outlined above, various alternatives, modifications, variations, improvements, and/or substantial equivalents, whether known or that are or may be presently unforeseen, may become apparent to those having at least ordinary skill in the art. Accordingly, the exemplary embodiments of the invention, as set forth above, are intended to be illustrative, not limiting. Various changes may be made without departing from the spirit and scope of the invention. Therefore, the claims as filed and as they may be amended are intended to embrace all known or later-developed alternatives, modifications variations, improvements, and/or substantial equivalents.

What is claimed is:

1. A grating-outcoupled microcavity disk resonator, defining a plane and having a substantially smooth curved outer periphery, bounded by reflective walls, around and within which light can circulate, the resonator including:
   at least one buried grating region disposed in the plane of the grating-outcoupled microcavity disk resonator, the grating region serving to outcouple light circulating within the curved outer periphery into free space modes propagating out of the plane of the resonator;
   a first waveguide layer;
   a quantum-well active layer;
   a second waveguide layer on the other side of the quantum-well active layer from the first waveguide layer; and
   a first cladding layer on the other side of the first waveguide layer from the quantum-well active layer, the grating region formed in the vicinity of the interface between the first waveguide layer and the first cladding layer.

2. The grating-outcoupled microcavity disk resonator of claim 1, wherein the grating region is a set of periodic features.

3. The grating-outcoupled microcavity disk resonator of claim 2, wherein the periodic features have at least one of a trapezoidal shape, a rectangular shape, and a sinusoidal shape.

4. The grating-outcoupled microcavity resonator of claim 1, wherein the grating region exists in at least one region near the outer periphery.

5. The grating-outcoupled microcavity disk resonator of claim 4, wherein each of the at least one region includes a grating having a periodicity that is different from the other regions.

6. The grating-outcoupled microcavity disk resonator of claim 1, wherein the grating region extends around an entire circumference of the resonator.

7. The grating-outcoupled microcavity disk resonator of claim 1, wherein the grating region forms at least a second-order grating.

8. The grating-outcoupled microcavity disk resonator of claim 1, wherein the grating region forms a distributed feedback grating.

9. The grating-outcoupled microcavity disk resonator of claim 1, wherein the grating region includes dielectric material formed in stripes on or over the first waveguide layer.

10. The grating-outcoupled microcavity disk resonator of claim 1, further comprising a reflective layer associated with the grating region.

11. The grating-outcoupled microcavity disk resonator of claim 10, wherein the reflective layer reflects a wave which constructively interferes with a diffracted wave generated by the grating region.

12. The grating-outcoupled microcavity disk resonator of claim 10, wherein the reflective layer is displaced by a multiple of about $\lambda/2$ from the grating region, wherein $\lambda$ is a wavelength of the light traveling within the disk resonator.

13. The grating-outcoupled microcavity disk resonator of claim 1, wherein the grating region is a set of periodic features formed in the first cladding layer included in the grating-outcoupled microcavity disk resonator.

14. The grating-outcoupled microcavity disk resonator of claim 1, wherein the grating region is formed in both the first cladding layer and the first waveguide layer of the grating-outcoupled microcavity disk resonator.

15. The grating-outcoupled microcavity disk resonator of claim 1, wherein the at least one grating region includes a first grating region formed in the first cladding layer and a second grating region formed in a second cladding layer located in the grating-outcoupled microcavity disk resonator on the other side of the quantum-well active layer from the first cladding layer.

16. The grating-outcoupled microcavity disk resonator of claim 1, wherein the grating-outcoupled microcavity disk resonator comprises a III-V nitride semiconductor heterostructure formed on a substrate.

17. The grating-outcoupled microcavity disk resonator of claim 16, wherein the substrate comprises at least one of sapphire, silicon carbide, GaN, AlGaN, AlN, and silicon.

18. The grating-outcoupled microcavity disk resonator of claim 1, wherein the grating-outcoupled cavity resonator comprises a heterostructure formed using at least one of GaAs, InAs, AlAs, InP, AlP, and GaP.

19. The grating-outcoupled microcavity disk resonator of claim 1, wherein the grating-outcoupled microcavity disk resonator comprises a heterostructure formed using at least one of InGaAs, AlGaAs, InAlAs, InGaAsP, InGaP, and InAlP.

20. The grating-outcoupled microcavity disk resonator of claim 1, wherein the grating-outcoupled microcavity disk resonator comprises a heterostructure formed using at least one of ZnSe, CdS, MgS, MgSe, CdSe, CdTe, ZnO, and MgO.

21. A grating-outcoupled microcavity disk resonator, defining a plane and having a substantially smooth curved outer periphery, bounded by reflective walls, around and within which light can circulate, the resonator including:

at least one buried grating region disposed in the plane of the grating-outcoupled microcavity disk resonator, the grating region having a substantially symmetric cross-sectional profile and serving to outcouple light circulating within the curved outer periphery into free space modes propagating out of the plane of the resonator;

a first waveguide layer;

a quantum-well active layer;

a second waveguide layer on the other side of the quantum-well active layer from the first waveguide layer; and a first cladding layer on the other side of the first waveguide layer from the quantum-well active layer, the grating region formed in the vicinity of the interface between the first waveguide layer and the first cladding layer.

22. The grating-outcoupled microcavity disk resonator of claim 21, further comprising:

a carrier confinement layer between the first waveguide layer and the quantum-well active layer, the refractive index of the first waveguide layer being larger than the refractive index of the carrier confinement layer and smaller than the refractive index of the first cladding layer.

23. The grating-outcoupled microcavity disk resonator of claim 22, further comprising:

a second cladding layer on the other side of the second waveguide layer from the quantum-well active layer, the refractive index of the second waveguide layer being larger than the refractive index of the refractive index of the second cladding layer and smaller than the refractive index of the quantum-well active layer.

24. The grating-outcoupled microcavity disk resonator of claim 23, the first and second waveguide layers, the quantum-well active layer, the first and second cladding layers, and THE carrier confinement layer each being made from a III-V nitrade material.

25. The grating-outcoupled microcavity disk resonator of claim 24, the second waveguide layer being selected from the group consisting of:

n-type (In)GaN:Si, (In)GaN-undoped, AlGaN, and AlGaInN.

26. The grating-outcoupled microcavity disk resonator of claim 24, the quantum-well layer being (In)(Al)GaN.

27. The grating-outcoupled microcavity disk resonator of claim 24, the second waveguide layer being selected from the group consisting of:

p-type (In)GaN:Mg, (In)GaN:undoped, AlGaN, and AlGaInN.

28. The grating-outcoupled microcavity disk resonator of claim 24, the carrier confinement layer being p:type $Al_xGa_{1-x}N:Mg$ with an Al mole fraction in the range of x=0.5 to x=0.4.

29. The grating-outcoupled microcavity disk resonator of claim 24, the first cladding letter being p:type AlGaN:Mg.

30. The grating-outcoupled microcavity disk resonator of claim 24, the second cladding layer being n:type (In)AlGaN or n:type AlGaN:Si.

* * * * *